(12) United States Patent
Dutta et al.

(10) Patent No.: US 12,414,480 B2
(45) Date of Patent: Sep. 9, 2025

(54) MRAM BOTTOM ELECTRODE CONTACT WITH TAPER PROFILE

(71) Applicant: INTERNATIONAL BUSINESS MACHINES CORPORATION, Armonk, NY (US)

(72) Inventors: Ashim Dutta, Clifton Park, NY (US); Saumya Sharma, Easton, CT (US); Tianji Zhou, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 759 days.

(21) Appl. No.: 17/643,582

(22) Filed: Dec. 9, 2021

(65) Prior Publication Data

US 2023/0189660 A1 Jun. 15, 2023

(51) Int. Cl.
*H10N 50/80* (2023.01)
*H10B 61/00* (2023.01)
*H10N 50/01* (2023.01)
*H10N 50/10* (2023.01)

(52) U.S. Cl.
CPC ............ *H10N 50/80* (2023.02); *H10B 61/00* (2023.02); *H10N 50/01* (2023.02); *H10N 50/10* (2023.02)

(58) Field of Classification Search
None
See application file for complete search history.

(56) References Cited

U.S. PATENT DOCUMENTS

| | | | |
|---|---|---|---|
| 6,783,999 B1 * | 8/2004 | Lee | H10B 61/00 257/E27.005 |
| 8,334,213 B2 | 12/2012 | Mao | |
| 9,166,154 B2 | 10/2015 | Satoh | |
| 9,343,659 B1 | 5/2016 | Lu | |
| 9,450,180 B1 * | 9/2016 | Annunziata | H10N 50/80 |
| 9,564,577 B1 | 2/2017 | Hsu | |
| 10,096,769 B2 | 10/2018 | Bhosale | |
| 10,164,173 B2 | 12/2018 | Hwang | |
| 10,461,248 B2 | 10/2019 | Bhosale | |
| 2013/0032775 A1 * | 2/2013 | Satoh | H10N 70/826 257/1 |
| 2013/0119494 A1 | 5/2013 | Li | |
| 2016/0365505 A1 | 12/2016 | Lu | |
| 2018/0040668 A1 * | 2/2018 | Park | H10N 50/10 |
| 2018/0108835 A1 | 4/2018 | Huang | |
| 2019/0157344 A1 * | 5/2019 | Wei | H01L 21/762 |
| 2020/0075857 A1 * | 3/2020 | Chou | H10B 63/30 |
| 2022/0271217 A1 * | 8/2022 | Tien | H10N 50/01 |

* cited by examiner

*Primary Examiner* — Asok K Sarkar
(74) *Attorney, Agent, or Firm* — Jeffrey M. Ingalls

(57) ABSTRACT

An MRAM device is provided. The MRAM device includes a semiconductor device comprising a bottom contact electrode (BEC), and an MRAM stack formed on the BEC. A width of an upper portion of the BEC is less than a width of the MRAM stack.

20 Claims, 20 Drawing Sheets

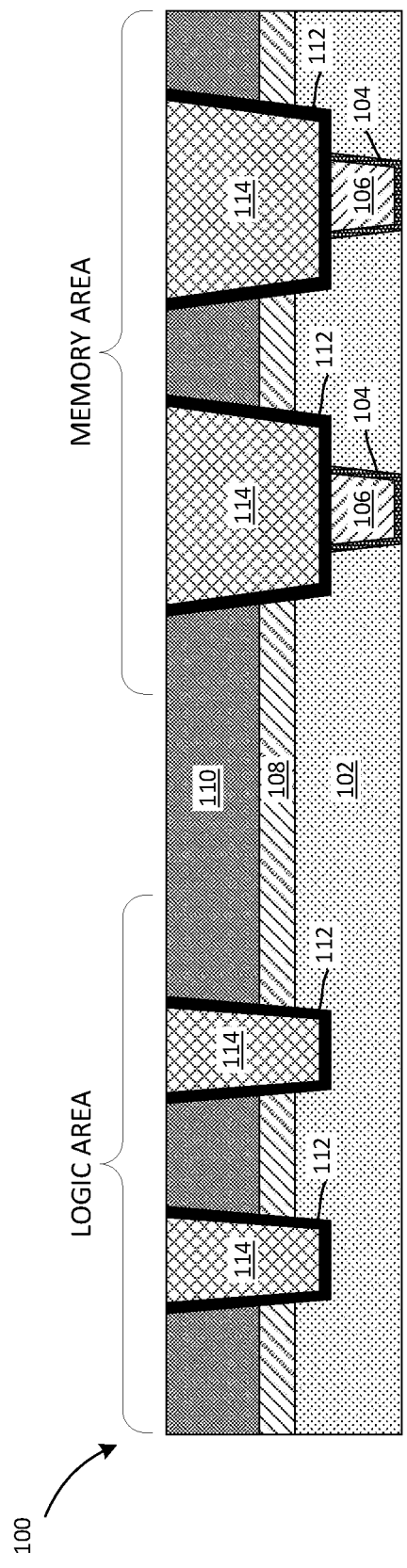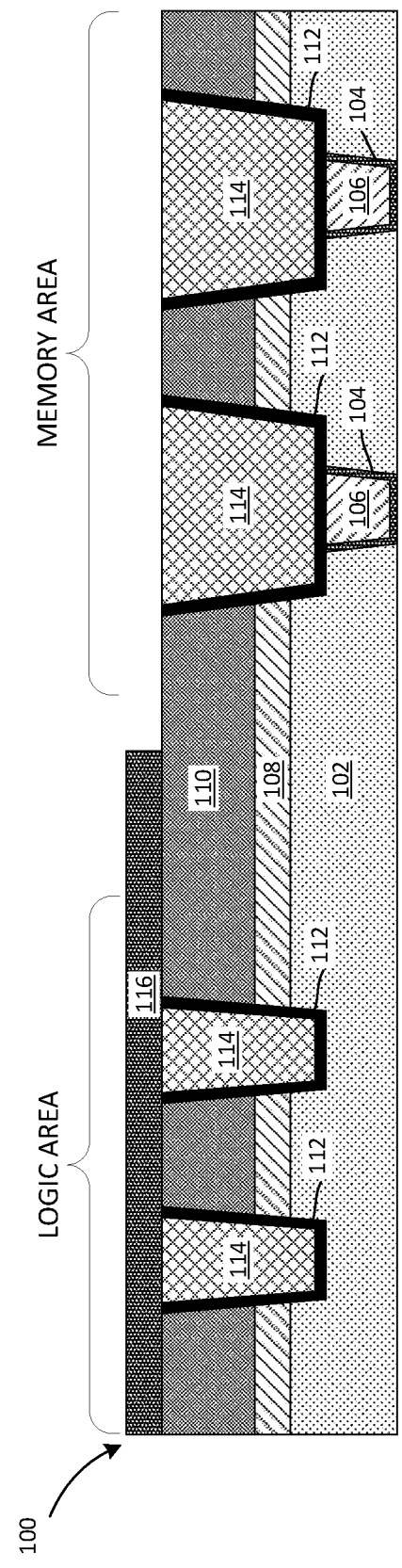
FIG. 1
FIG. 2

MRAM BOTTOM ELECTRODE CONTACT WITH TAPER PROFILE

BACKGROUND

The present disclosure relates to magnetic random access memory (MRAM) devices based on perpendicular magnetic tunnel junction (MTJ) structures. Certain MRAM devices may be fabricated to include a bottom electrode, an MRAM stack, and a top electrode. In general, MRAM devices may be used in a variety of applications. One example application is embedded storage (e.g., eFlash replacement). Another example is cache (e.g., embedded dynamic random-access memory (eDRAM), or static random-access memory (SRAM)). Certain MTJ structures include a Co-based synthetic anti-ferromagnet (SAF), a CoFeB-based reference layer, a MgO-based tunnel barrier, a CoFeB-based free layer, and cap layers containing, for example, Ta and/or Ru. Embedded MTJ structures are usually formed by subtractive patterning of blanket MTJ stacks into pillars between two metal levels. A bottom electrode contact (BEC) may be formed beneath the MTJ pillar. As scaling of MRAM devices continues, it may be desirable to maintain a certain minimum height of the BEC for underlying circuit protection in the logic area during ion beam etching (IBE).

SUMMARY

Embodiments of the present disclosure relate to an MRAM device. The MRAM device includes a semiconductor device comprising a bottom contact electrode (BEC), and an MRAM stack formed on the BEC. A width of an upper portion of the BEC is less than a width of the MRAM stack.

Other embodiments relate to a method of manufacturing a semiconductor device. The method includes forming a bottom contact electrode (BEC), and forming an MRAM stack on the BEC. A width of an upper portion of the BEC is less than a width of the MRAM stack.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

FIG. 1 is a cross-sectional view of a semiconductor device that includes an MRAM device including a BEC having a tapered shape, at an intermediate stage of the manufacturing process, according to embodiments.

FIG. 2 is a cross-sectional view of the semiconductor device of FIG. 1 after additional fabrication operations, according to embodiments.

DETAILED DESCRIPTION

Figure 3:
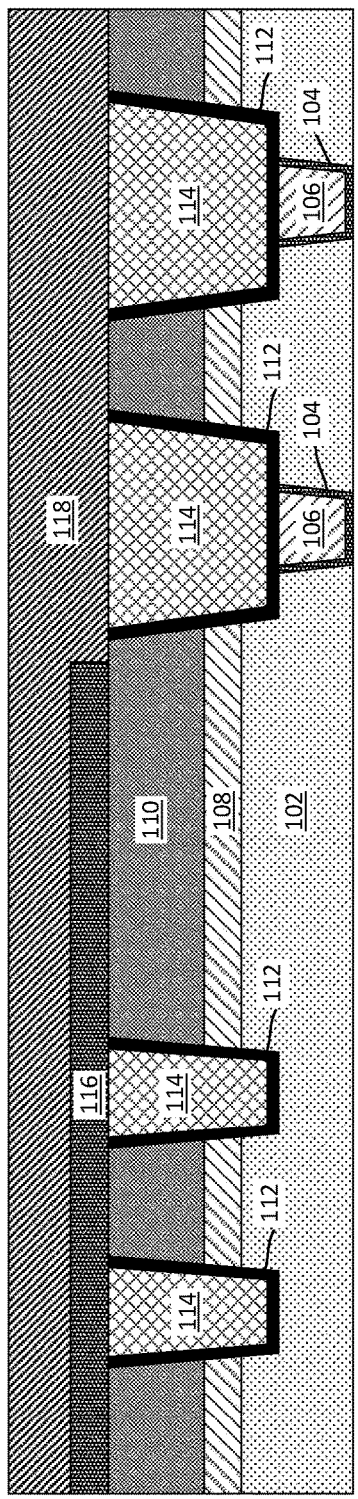
FIG. 3 is a cross-sectional view of the semiconductor device of FIG. 2 after additional fabrication operations, according to embodiments.

The present disclosure describes MRAM devices including magnetic tunnel junction ("MTJ") stacks and methods of manufacturing MRAM devices. In particular, the present disclosure describes MRAM devices and methods of manufacturing same, the devices including a structure of a bottom electrode contact (BEC) with a tapered sidewall profile. In certain embodiments, the bottom electrode contact has a tapered sidewall profile with a top critical dimension (CD) smaller than a bottom CD. This may increase a margin for exposing the BEC during ion beat etching (IBE) due to any misalignment. In certain examples, a stepped BEC is provided that may increase the BEC height and the BEC dielectric thickness without significant increase the BEC aspect ratio. This may help with scaling the MRAM device and the BEC without compromising on the thickness of the BEC dielectric needed to protect logic area interconnect structure from IBE damage. This is very important aspect of this invention because minimum BEC dielectric thickness needed for logic area protection during IBE dies not scale with MRAM device or MRAM stack thickness change.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, embedded DRAM (eDRAM) is a dynamic random-access memory (DRAM) integrated on the same die or multi-chip module (MCM) of an application-specific integrated circuit (ASIC) or microprocessor. eDRAM has been implemented in silicon-on-insulator (SOI) technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years. Magnetoresistive random-access memory (MRAM) devices using magnetic tunnel junctions (MTJ) are one option to replace existing eDRAM technologies. MRAM is a non-volatile memory, and this benefit is a driving factor that is accelerating the development of this memory technology.

A magnetic tunnel junction (MTJ) device, which is a primary storage element in a magnetic random access memory (MRAM), is a magnetic storage and switching device in which two ferromagnetic layers are separated by a thin insulating oxide layer (i.e., a tunnel barrier layer) to form a stacked structure. The tunnel barrier layer may comprise, for example, magnesium oxide or aluminum oxide. One of the ferromagnetic layers has a magnetization that is fixed, and it is therefore referred to as a magnetic fixed layer (or pinned layer, or reference layer). However, the other ferromagnetic layer has a magnetization that can change, and it is therefore referred to as a free layer (or magnetic free layer). When a bias is applied to the MTJ device, electrons that are spin polarized by the ferromagnetic layers traverse the insulating barrier through a process known as quantum tunneling to generate an electric current whose magnitude depends on an orientation of magnetization of the ferromagnetic layers. The MTJ device will exhibit a low resistance when a magnetic moment of the free layer is parallel to the fixed layer magnetic moment, and it will exhibit a high resistance when the magnetic moment of the free layer is oriented anti-parallel to the fixed layer magnetic moment.

The materials and geometries used to build the stack of different layers forming the MTJ device are factors that affect the characteristics of the device in terms of speed (i.e., switching time) and power consumption (e.g., voltage and/or current required to switch the device from one state to another). As discussed briefly above, certain MTJ devices have a pillar structure (i.e., a stack of materials) having a cylindrical shape, where current flows from a top layer to a bottom layer, or vice versa, in order to switch the magnetization of one ferromagnetic layer. These types of MTJ devices are generally referred to as spin transfer torque (STT) MTJ devices. Certain STT MRAM devices may have limited switching speed and endurance in comparison to static random access memory (SRAM) devices (i.e., random access memory that retains data bits in its memory as long as power is being supplied). Other types of MTJ devices are referred to as spin orbit torque (SOT) devices. In the SOT type of device, the stacked pillar structure is still cylindrically shaped, but the stack is deposited on top of a heavy metal conductor. In the SOT type of MTJ device, current flows horizontally in this conductor and switches the magnetization of the ferromagnetic layer at the interface.

In STT type MRAM devices, the manufacture of the devices is often performed in conjunction with forming middle-of-line (MOL) or back-end-of-line (BEOL) layers. This may be referred to as embedded MRAM, where the MRAM devices are embedded in, or formed in conjunction with these layers. In general, front-end-of-line (FEOL) refers to the set of process steps that form transistors and other circuit elements (such as resistors and capacitors) that are later connected electrically with middle-of-line (MOL) and back-end-of-line (BEOL) layers. In general, MOL refers to the set of wafer processing steps used to create the structures that provide the local electrical connections between transistors (e.g., gate contact formation). MOL processing generally occurs after FEOL processes and before BEOL processes. In general, the BEOL is the portion of IC fabrication where the individual devices (transistors, capacitors, resistors, etc.) are interconnected with wiring on the wafer.

As discussed above, MRAM devices may be useful for a variety of different applications, such as embedded storage and cache. For high performance MRAM devices based on perpendicular MTJ structures, the embedded MRAM device patterning using an ion beam etch (IBE) step may require that a bottom electrode contact (BEC) is hidden underneath the MRAM pillar in order to avoid sputtering (i.e., a phenomenon in which microscopic particles of a solid material are ejected from its surface, after the material is itself bombarded by energetic particles of a plasma or gas) and redeposition of the BEC metal on the MTJ sidewall. In other words, if the BEC is exposed during the patterning of the MRAM pillar (i.e., during the ion beam etch step) the metals from the BEC may get sputtered to the sidewall of the MTJ pillar, which may cause electrical shorts. As such, it may be desirable to minimize any deposition of BEC metal on the MTJ stack during this manufacturing step by not exposing the BEC contact.

This requirement for using an etching process may pose a constraint on the top CD of the bottom electrode contact, and subsequently may limit the height of bottom electrode contact for MRAM device scaling. In other words, as the size of the MTJ stacks of the MRAM devices become smaller, there may consequently be a need to have a smaller BEC size to prevent this type of metal sputtering. Moreover, a taller BEC may be needed in order to provide a thick enough dielectric layer for underlying circuit protection in the logic area during IBE. The need for a particular height of the BEC combined with the reduction in CD may cause an increase in the aspect ration of the BEC. In related damascene processes that may be used in forming the BEC, a high aspect ratio can be problematic because there may be incomplete filling of the via (i.e., into which the BEC is formed) or voids being present in the BEC.

However, as described in detail herein, the present embodiments provide a method and structure for forming a bottom electrode contact with tapered sidewall profile. In certain embodiments, rather than using an additive process (e.g., a damascene process) to form the BEC, a subtractive etching process is used, which results in the tapered sidewall structure of the BEC where the top CD is smaller than the bottom CD of the BEC. When the bottom electrode contact (BEC) has a tapered sidewall profile with a top CD smaller than the bottom CD, this may increase a margin for exposing the BEC during IBE due to any misalignment. Moreover, because there is no requirement for filling the BEC in the present embodiments, there is no issue with a high aspect ratio (i.e., incomplete filling or voids in the BEC). Moreover, the conical shape (or truncated conical shape), for example, of the BEC (versus an inverse conical shape resulting from a related damascene process) results in the lower CD on the top of the BEC. The lower CD of the top of the BEC in the present embodiments may make it easier to hide the BEC under the MRAM stack, and thus eliminate or reduce any sputtering that may occur in the IBE processing step.

Referring now to the drawings in which like numerals represent the same or similar elements and initially to FIG. 1, an exemplary method of manufacturing a semiconductor device 100 (i.e., an MRAM device) to which the present embodiments may be applied is shown. In certain examples, several back end of line ("BEOL") layers and front end of line (FEOL) layers may be formed. In general, the front-end-of-line (FEOL) is the first portion of IC fabrication where the individual devices (transistors, capacitors, resistors, etc.) are patterned in the semiconductor. FEOL generally covers everything up to (but not including) the deposition of metal interconnect layers. In general, the BEOL is the second portion of IC fabrication where the individual devices (transistors, capacitors, resistors, etc.) are interconnected with wiring on the wafer. The BEOL metal layers (not shown) can include, for example, Cu, TaN, Ta, Ti, TiN or a combination thereof. A BEOL dielectric layer (not shown) may be formed on the sides of one or more of the BEOL metal layers. The BEOL dielectric layer may be composed of, for example, $SiO_x$, $SiN_x$, SiBCN, low-κ, NBLOK, or any other suitable dielectric material. The structure including the FEOL/BEOL layers may be a starting structure upon which the MRAM devices are formed.

As shown in the semiconductor device 100 of FIG. 1, an oxide layer 102 is provided as a base layer into which an interconnect structure of the semiconductor device 100 may be formed. The oxide layer 102 may include, for example, TEOS, or ultra low-κ (ULK) etc. In certain embodiments, a combined via interconnect structure (e.g., a metal liner layer 104 and a metal layer 106) is provided in the oxide layer 102, and this may be included in one of the BEOL layers. In certain examples, the metal liner layer 104 may include, Nb, NbN, W, WN, Ta, TaN, Ti, TiN, Ru, Mo, Cr, V, Pd, Pt, Rh, Sc, Al and other high melting point metals or conductive metal nitrides. It should be appreciated that the interconnect structure shown in FIG. 1 is merely one example, and any other suitable interconnect structure (e.g., number of layers, size, number of contact, etc.) may be used. As shown in FIG. 1, a cap layer 108 (or dielectric cap layer) may be formed on the oxide layer 102. The cap layer 108 may be comprised of, for example, an NBLOK ($SiC_xN_yH_z$) dielectric capping material. In certain examples, the cap layer 108 may comprise at least one of SiC, SiN, SiCN, hydrogen doped SiCN, etc.

As shown in FIG. 1, a first interlayer dielectric (ILD) layer 110 is then formed on the cap layer 108. The first ILD layer 110 may include, for example, an ultra-low-κ (ULK) material or any other suitable dielectric material(s). Vias are then formed (not shown in FIG. 1) into the first ILD layer 110, the cap layer 108 and at least partially into the oxide layer 102. In the memory area, as shown in FIG. 1, these vias expose the combined via interconnect structure (e.g., a metal liner layer 104 and a metal layer 106). Then, a bottom metal liner layer 112 and a bottom metal layer 114 are formed in the vias, as shown in FIG. 1. These layers may be included in one of the BEOL layers. In certain examples, the bottom metal liner layer 112 may include, Nb, NbN, W, WN, Ta, TaN, Ti, TiN, Ru, Mo, Cr, V, Pd, Pt, Rh, Sc, Al and other high melting point metals or conductive metal nitrides. In certain examples, the bottom metal layer 114 may include, for example, Cu, W, Co, Ru, Al, etc. As shown in FIG. 1, the MRAM device includes a logic area and the memory area adjacent to the logic area.

Referring now to FIG. 2, this figure is a cross-sectional view of the semiconductor device 100 including the MRAM of FIG. 1 after additional fabrication operations, according to embodiments. As shown in FIG. 2, a dielectric cap layer 116 is formed on the first ILD layer 110 in the logic area of the semiconductor device 100. Thus, the bottom metal layers 114 in the memory area are still exposed.

Referring now to FIG. 3, this figure is a cross-sectional view of the semiconductor device 100 including the MRAM of FIG. 2 after additional fabrication operations, according to embodiments. As shown in FIG. 3, a bottom electrode contact (BEC) 118 layer is formed over the entire semiconductor device. In certain examples, the BEC 118 layer may include TaN, TiN, Ru, W, etc. However, it should be appreciated that the BEC 118 layer may include other suitable materials. Then, in certain embodiments, a CMP process may be utilized to planarize the surface of the BEC 118 layer.

Figure 4:
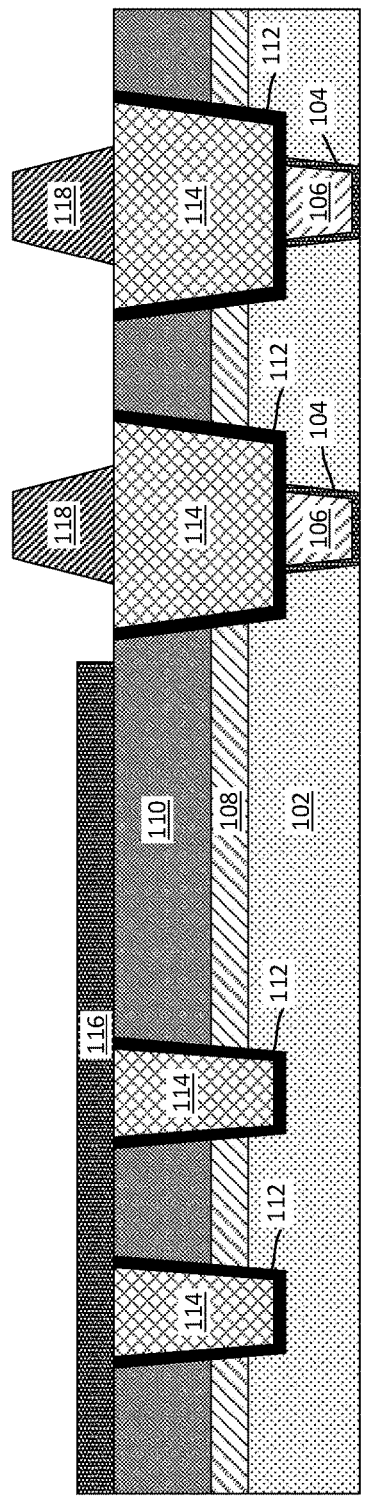
FIG. 4 is a cross-sectional view of the semiconductor device of FIG. 3 after additional fabrication operations, according to embodiments.

Referring now to FIG. 4, this figure is a cross-sectional view of the semiconductor device 100 including the MRAM of FIG. 3 after additional fabrication operations, according to embodiments. As shown in FIG. 4, a subtractive metal patterning process is used to form the BEC 118. In certain embodiments, as described above, because the BEC 118 is formed by a subtractive process (i.e., rather than related additive damascene process), the BEC 118 has a tapered shape. When the bottom electrode contact (BEC) 118 has a tapered sidewall profile with a top CD smaller than the bottom CD (i.e., the profile narrows in an upward direction), this may increase a margin for exposing the BEC 118 during IBE due to any misalignment. Moreover, because there is no requirement for filling the BEC 118 in the present embodiments, there is no issue with a high aspect ratio (i.e., incomplete filling or voids in the BEC 118). Moreover, the conical shape, for example, of the BEC (versus an inverse conical shape resulting from a related damascene process) results in the lower CD on the top of the BEC 118. The lower CD of the top of the BEC 118 in the present embodiments may make it easier to hide the BEC 118 under the MRAM stack, and thus eliminate or reduce any sputtering that may occur in the IBE processing step. It should be appreciated that the BEC 118 may be patterned by any suitable combination of processing steps, including using lithography masks (e.g., a single layer or multilayer mask) to transfer the pattern, and then etching.

Figure 5:
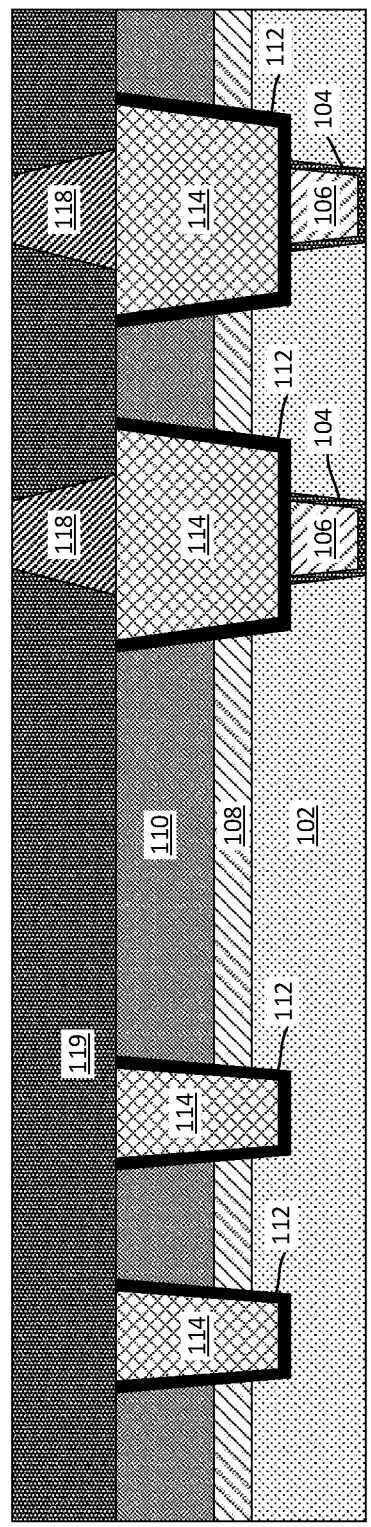
FIG. 5 is a cross-sectional view of the semiconductor device of FIG. 4 after additional fabrication operations, according to embodiments.

Referring now to FIG. 5, this figure is a cross-sectional view of the semiconductor device 100 including the MRAM of FIG. 4 after additional fabrication operations, according to embodiments. As shown in FIG. 5, a second ILD layer 119 is deposited over the entire semiconductor device 100 and fills in areas between adjacent BECs 118. Then, in certain embodiments, a CMP process may be utilized to planarize the surface of the second ILD layer 119 and expose the top surfaces of the BECs 118.

Figure 6:
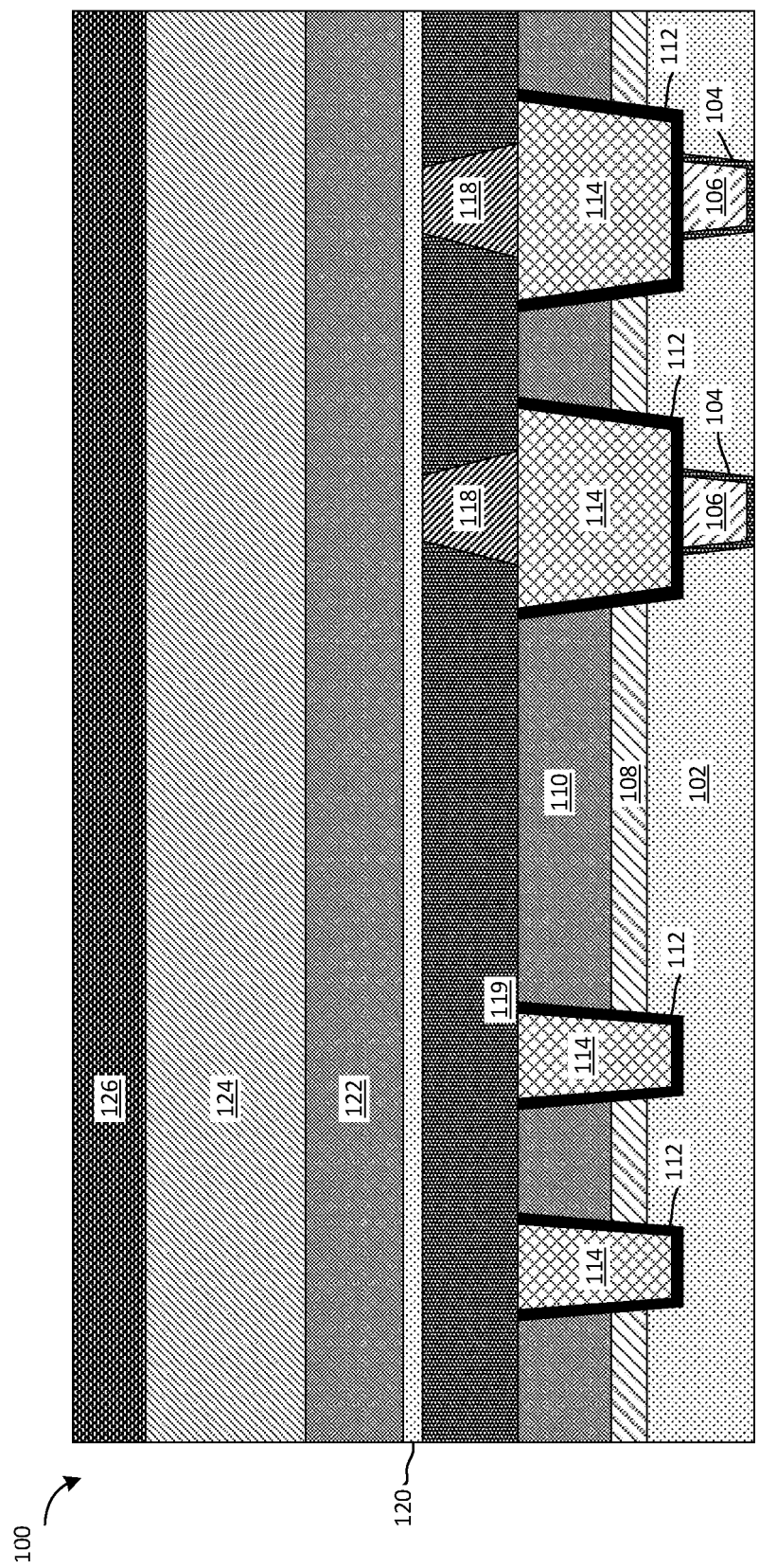
FIG. 6 is a cross-sectional view of the semiconductor device of FIG. 5 after additional fabrication operations, according to embodiments.

Referring now to FIG. 6, this figure is a cross-sectional view of the semiconductor device 100 including the MRAM of FIG. 5 after additional fabrication operations, according to embodiments. As shown in FIG. 6, an MRAM stack is formed on the upper surfaces of the BEC 118 and the second ILD layer 119. The MRAM stack may include multiple layers such as, for example, multiple magnetic layers separated by an insulating layer. In certain embodiments, the MRAM stack includes a bottom electrode 120, an MTJ stack 122, and a top electrode 124. The top electrode 124 may include one or more of Nb, NbN, W, WN, Ta, TaN, Ti, TiN, Ru, Mo, Cr, V, Pd, Pt, Rh, Sc, Al and other high melting point metals or conductive metal nitrides, etc. In certain embodiments, the MTJ stack 122 includes a reference layer (not shown), a tunnel barrier layer (not shown), and a magnetic free layer (not shown). The reference layer (or fixed layer) may, for example, be annealed in a magnetic field to set a polarization state of the reference layer in the MTJ stack 122. The tunnel barrier layer is formed on the reference layer. Following the formation of the tunnel barrier layer, the magnetic free layer is formed on the tunnel barrier layer.

It should be appreciated that this MRAM stack structure is only an example, and any other suitable MRAM stack structure known to one of skill in the art may be utilized. It should also be appreciated that this example MRAM stack structure may include one or more additional layers, include intervening layers, and any of the layers described with respect to the MRAM stack structure may contain a plurality of sublayers.

Next, as shown in FIG. 6, a hardmask 126 (e.g., a dielectric hardmask) is formed on the top electrode 124. In certain embodiments, the hardmask 126 is a multilayer hardmask. At least initially, the hardmask 126 is formed over the entire semiconductor device 100 as a continuous layer. In certain examples, the material of the hardmask 126 may be TaN or any other suitable material(s). For example, the hardmask 126 may include one or more of the following materials: TaN, WCN; TiN; TaAlN; WN; TEOS; low-κ and ULK etc.

Figure 7:
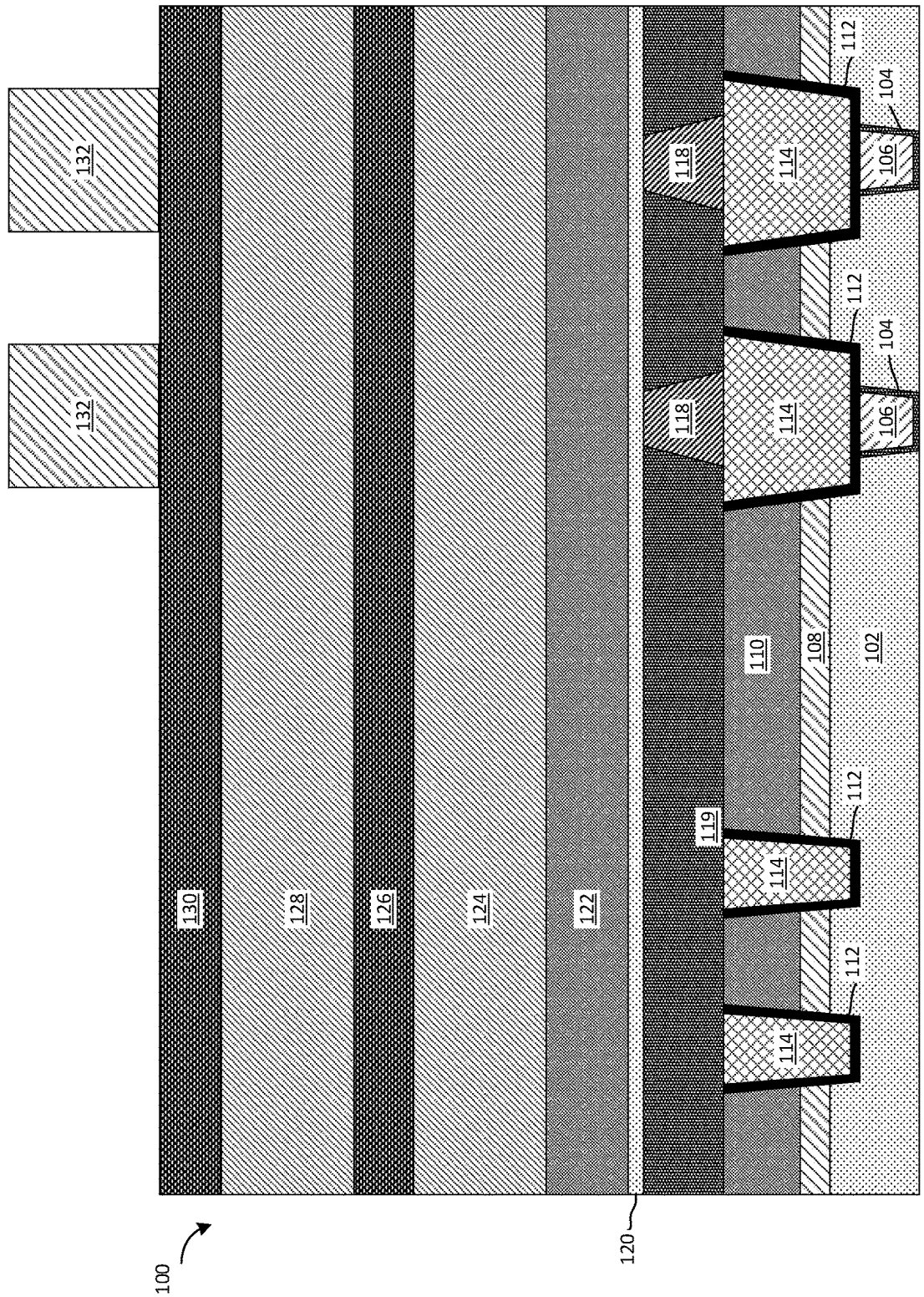
FIG. 7 is a cross-sectional view of the semiconductor device of FIG. 6 after additional fabrication operations, according to embodiments.

Referring now to FIG. 7, this figure is a cross-sectional view of the semiconductor device 100 including the MRAM of FIG. 6 after additional fabrication operations, according to embodiments. As shown in FIG. 7, a lithographic mask is formed that may be used to pattern the MRAM stack. In this example, the lithographic mask is a tri-layer mask including an organic planarizing layer 128, a lithographic hardmask 130 (e.g., SiARC, SiN, SiON, etc.), and a photoresist 132. It should be appreciated that the lithographic hardmask 130 may include a plurality of layers. The photoresist 132 may be formed by patterning using any suitable lithographic process.

Figure 8:
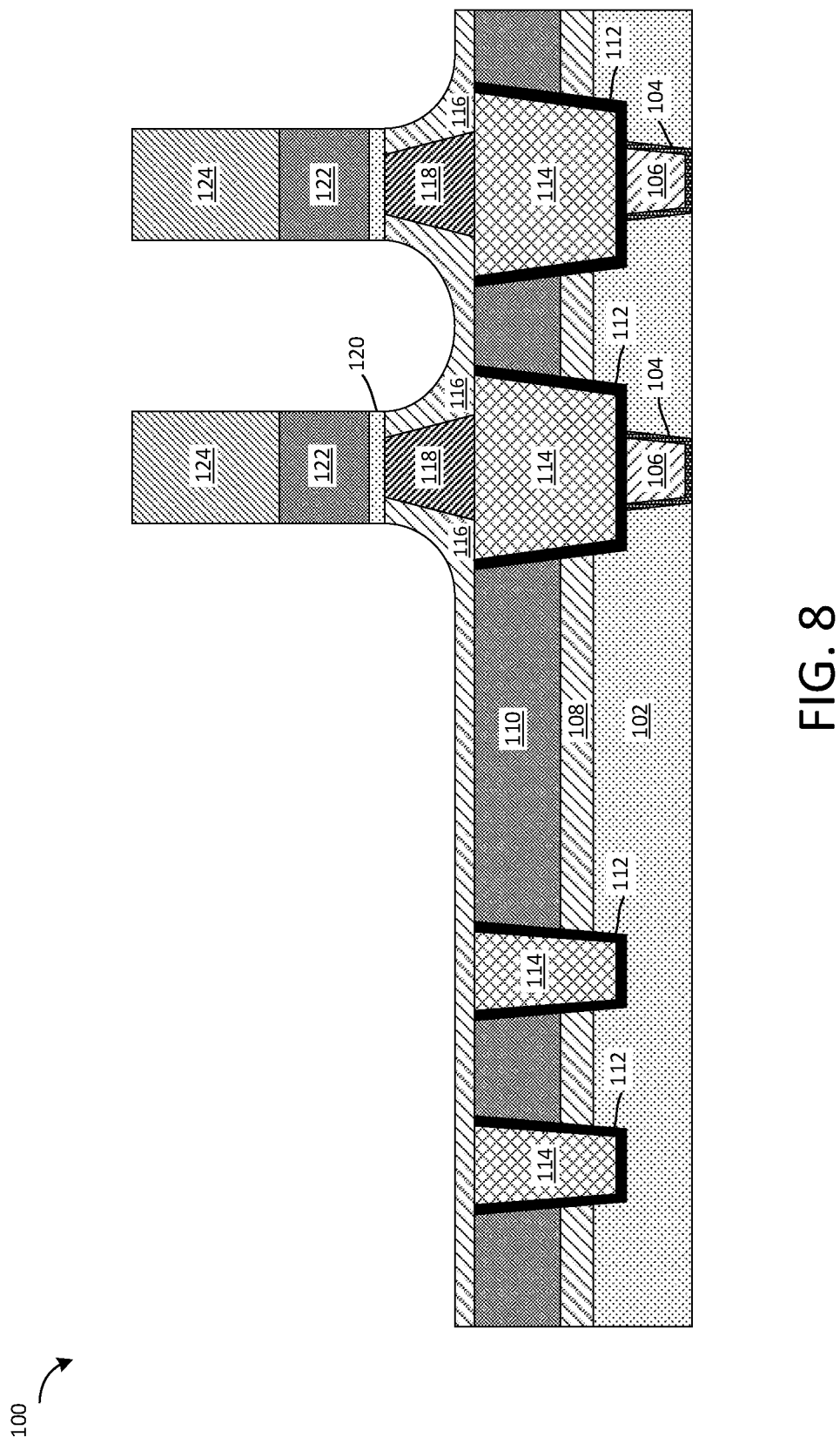
FIG. 8 is a cross-sectional view of the semiconductor device of FIG. 7 after additional fabrication operations, according to embodiments.

Referring now to FIG. 8, this figure is a cross-sectional view of the semiconductor device 100 including the MRAM of FIG. 7 after additional fabrication operations, according to embodiments. As shown in FIG. 8, the pattern of the photoresist 132 layer is transferred to the magnetic tunnel junction (MTJ) stack 122 (i.e., the reference layer, the tunnel barrier layer, and the magnetic free layer), which is etched to create the MTJ pillars. In one example, a two-step material removal process is used to form the MTJ pillars. In a first material removal step, RIE is used to remove the material down to the level of the top of the MTJ stack 122 (i.e., removing the material of the hardmask 126, the organic planarizing layer 128, and the lithographic hardmask 130. In a second material removal step, an IBE is used to remove the material of the MTJ stack 122, the bottom electrode 120 and at least portions of the dielectric cap layer 116. After the pattern of the photoresist 132 has been transferred to the create the MTJ pillars, the photoresist 132, the lithographic hardmask 130, the organic planarization layer 128 and the hardmask 126 are removed using, for example, an ashing process. The IBE etching process is a non-selective etching operation, so the dielectric material of the dielectric cap layer 116 is removed in such a way as to create a gouged sidewall profile (or slanted, or curved shaped profile). It should be appreciated that when using the IBE etching process, there is no portion of the BEC 118 that is exposed. Therefore, to the extent that there is any sputtering of material during IBE, it is only the dielectric material of the dielectric cap layer 116 that may be deposited on the sidewalls of the MTJ stack 122. Accordingly, in the present embodiments, there may be a benefit of reducing the occurrence of electrical shorts (i.e., relative to the related dama- scene process where portions of the BEC having the larger top CD could potentially be exposed due to misalignment) due the relative smaller CD of the top of the BEC 118. In other words, there is a sufficient thickness of dielectric cap layer 116 on the sidewalls of the BEC 118 so that even if there is some misalignment the sidewalls of the BEC 118 will not be exposed to the IBE process (i.e., low or no risk of metal sputtering from the BEC 118).

Figure 9:
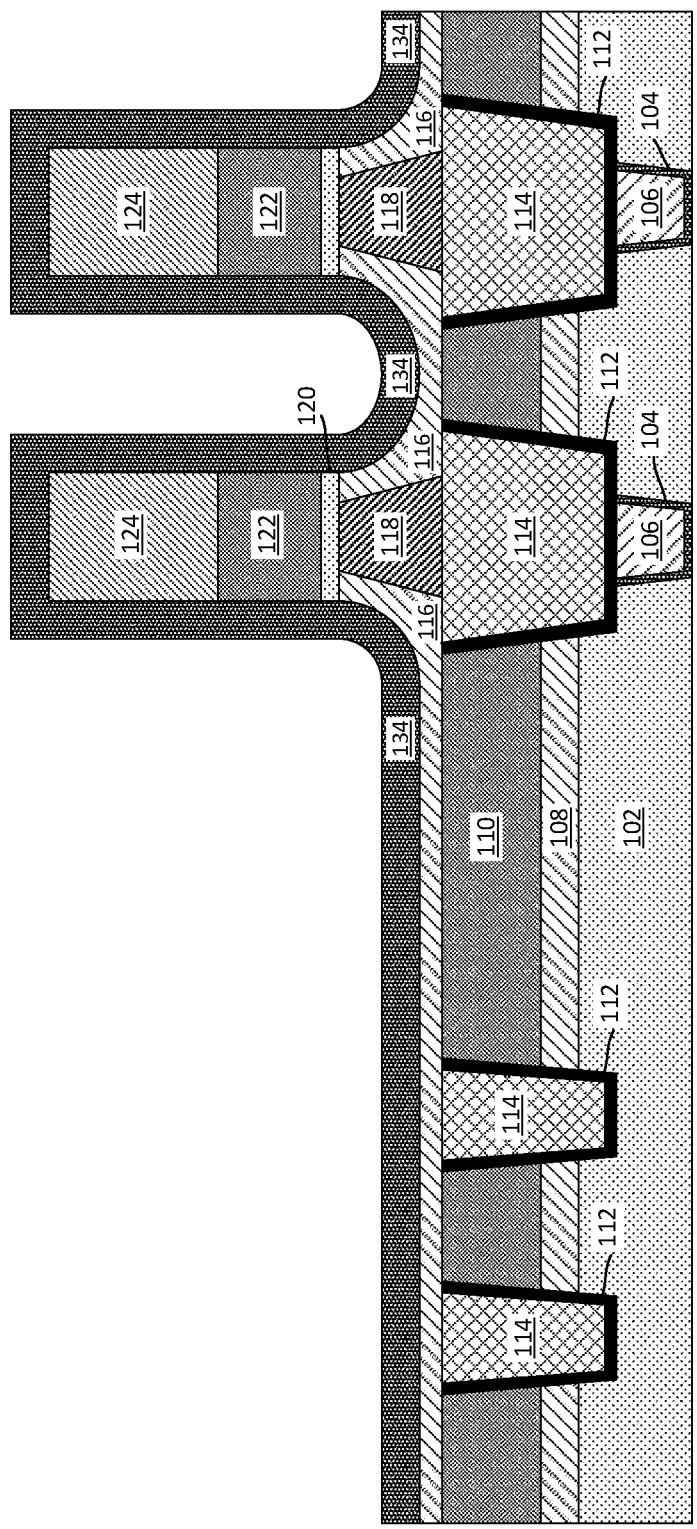
FIG. 9 is a cross-sectional view of the semiconductor device of FIG. 8 after additional fabrication operations, according to embodiments.

Referring now to FIG. 9, this figure is a cross-sectional view of the semiconductor device 100 including the MRAM of FIG. 8 after additional fabrication operations, according to embodiments. As shown in FIG. 9, a dielectric encapsulation layer 134 is formed over the entire semiconductor device 100. The dielectric encapsulation layer 134 may include, for example, SiN or SiCN (H), or any other suitable dielectric material. One purpose of the dielectric encapsulation layer 134 is to isolate the tunnel barrier layer of the MTJ stack 122 from the outside environment.

Figure 10:
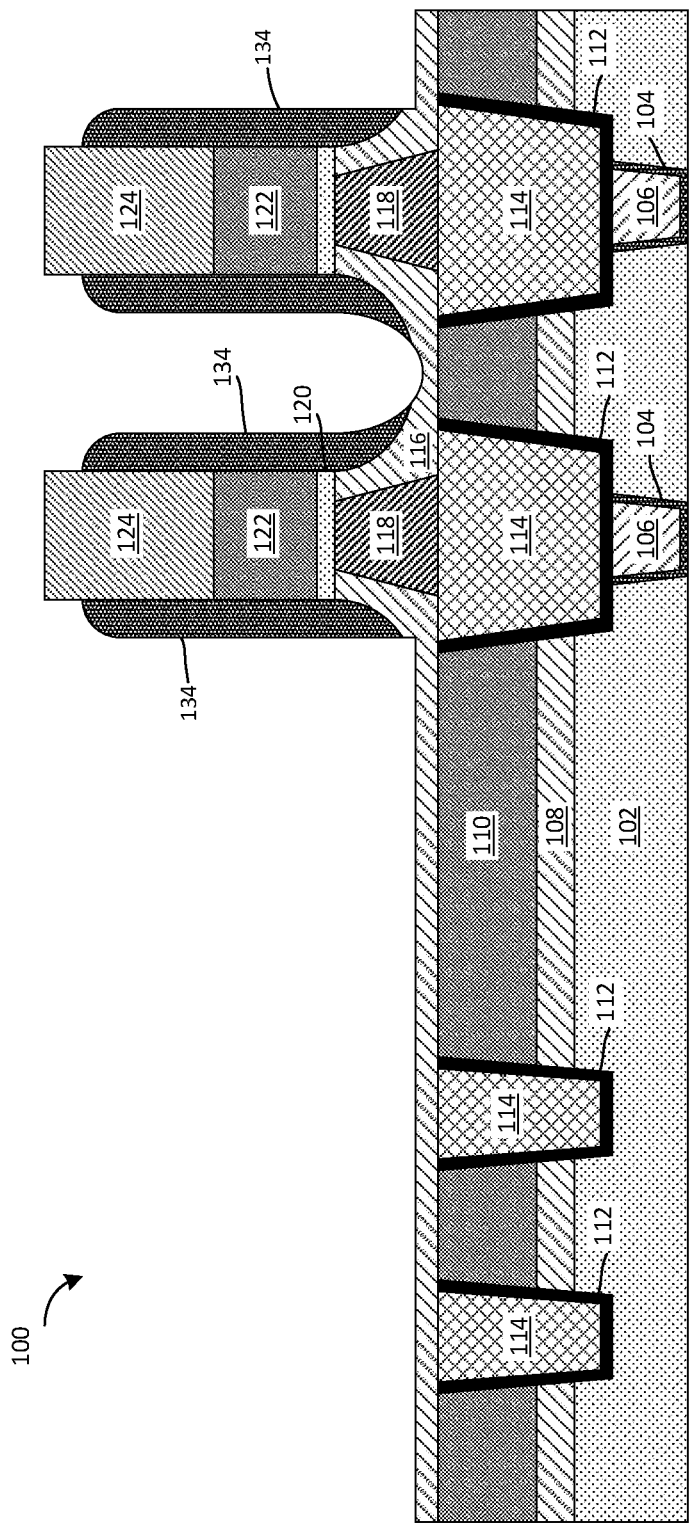
FIG. 10 is a cross-sectional view of the semiconductor device of FIG. 9 after additional fabrication operations, according to embodiments.

Referring now to FIG. 10, this figure is a cross-sectional view of the semiconductor device 100 including the MRAM of FIG. 9 after additional fabrication operations, according to embodiments. As shown in FIG. 10, an isotropic etching process is performed on the dielectric encapsulation layer 134 to remove the horizontal portions thereof. In other words, the dielectric encapsulation layer 134 only remains on the vertical sidewalls of the MTJ stack 122, bottom electrode 120 and top electrode 124. This material removal process also exposes the dielectric cap layer 116 in the logic area of the device.

Figure 11:
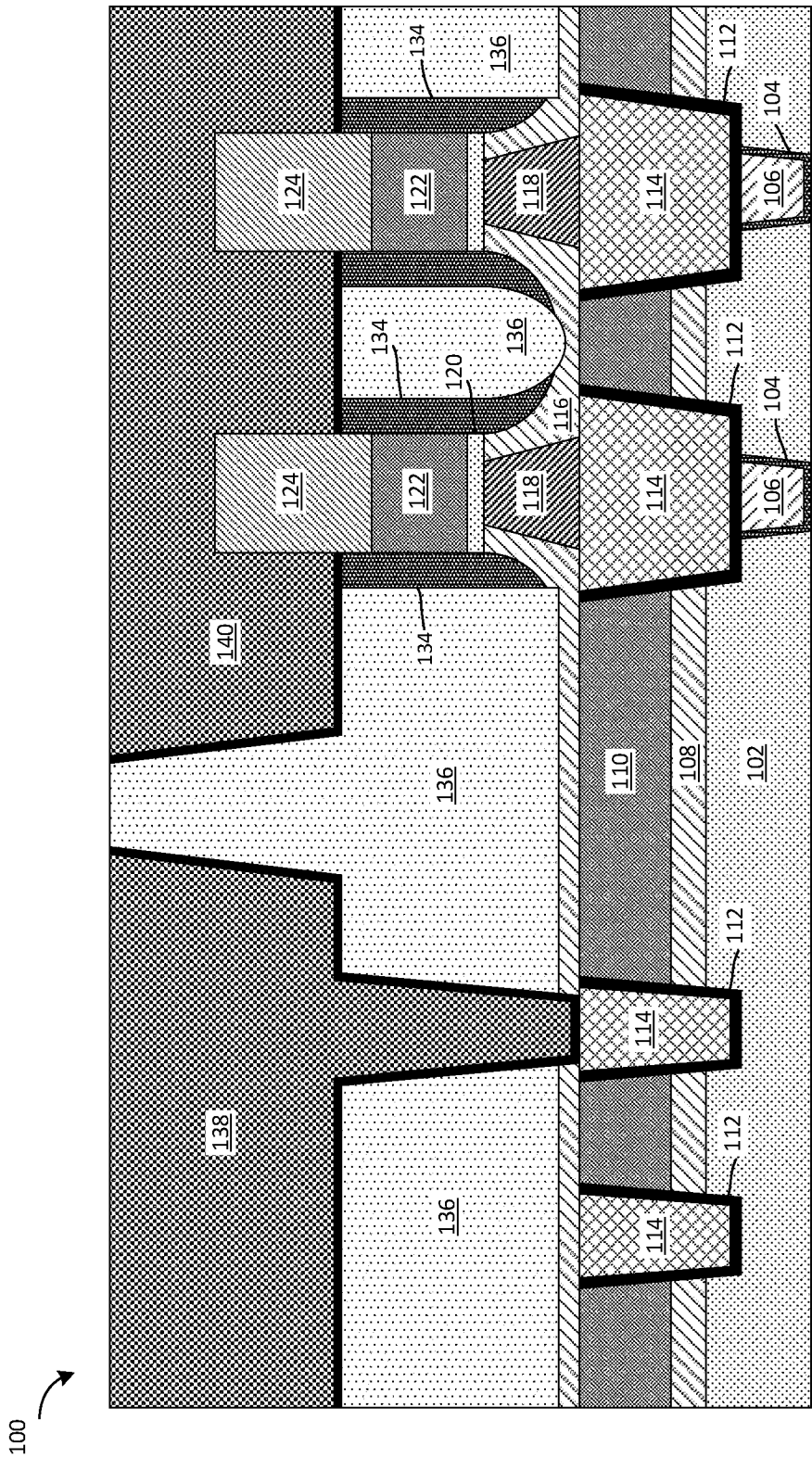
FIG. 11 is a cross-sectional view of the semiconductor device of FIG. 10 after additional fabrication operations, according to embodiments.

Referring now to FIG. 11, this figure is a cross-sectional view of the semiconductor device 100 including the MRAM of FIG. 10 after additional fabrication operations, according to embodiments. As shown in FIG. 11, a dielectric fill layer 136 is formed in and around the MTJ pillars. In certain examples, the formation of the dielectric fill layer 136 may be an oxide based dielectric material that may be formed by an aggressive deposition process. Thus, the dielectric encapsulation layer 134 may help protect the tunnel barrier layer from damage during such a process. Then, vias are formed in the logic area and memory area by any suitable combination of processes that are known to a person of skill in the art. A first top contact 138 is formed in the via in the logic area of the semiconductor device 100, and a second top contact 140 is formed in the via in the memory area.

Figure 12:
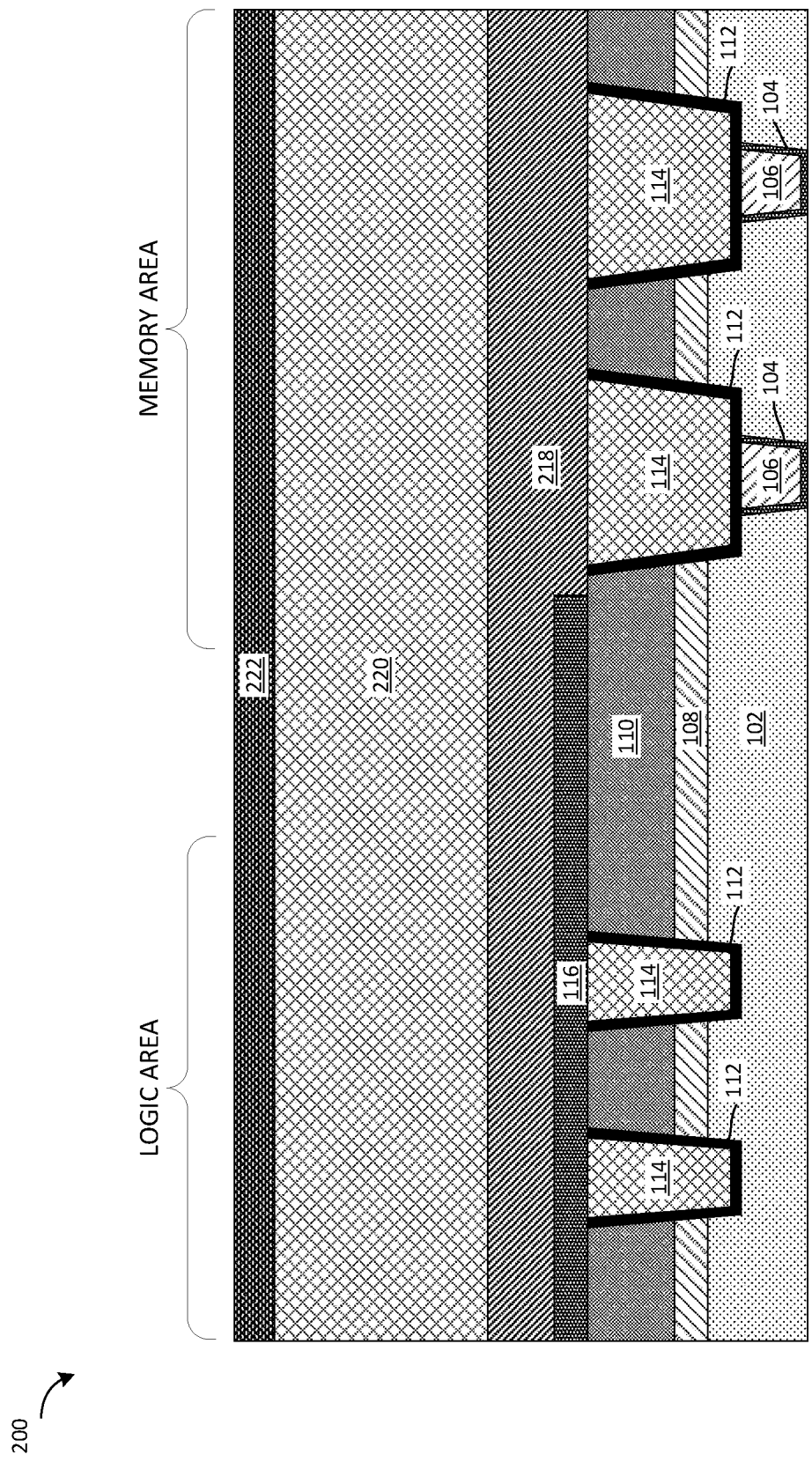
FIG. 12 is a cross-sectional view of a semiconductor device that includes an MRAM device at an intermediate stage of the manufacturing process, and where the BEC is a multilayered structure, according to embodiments.

Referring now to FIG. 12, an exemplary method of manufacturing a semiconductor device 200 (i.e., an MRAM device) to which the present embodiments may be applied is shown. The embodiments shown in FIGS. 12-22 are similar in certain respects to the MRAM devices shown in FIGS. 1-11, however the structure of the bottom electrode contact (BEC) is different. In certain examples (similar to the embodiments described above with respect to FIGS. 1-11), several back end of line ("BEOL") layers and front end of line (FEOL) layers may be formed. As shown in the semiconductor device 100 of FIG. 12, an oxide layer 102 is provided as a base layer into which an interconnect structure of the semiconductor device 100 may be formed. The oxide layer 102 may include, for example, TEOS, low-κ or ultra-low-κ (ULK) etc. In certain embodiments, a combined via interconnect structure (e.g., a metal liner layer 104 and a metal layer 106) is provided in the oxide layer 102, and this may be included in one of the BEOL layers. In certain examples, the metal liner layer 104 may include, Nb, NbN, W, WN, Ta, TaN, Ti, TiN, Ru, Mo, Cr, V, Pd, Pt, Rh, Sc, Al and other high melting point metals or conductive metal nitrides. It should be appreciated that the interconnect structure shown in FIG. 12 is merely one example, and any other suitable interconnect structure (e.g., number of layers, size, number of contact, etc.) may be used. As shown in FIG. 12, a cap layer 108 (or dielectric cap layer) may be formed on the oxide layer 102. The cap layer 108 may be comprised of, for example, an NBLOK (SiCxNyHz) dielectric capping material. In certain examples, the cap layer 108 may comprise at least one of SiC, SiN, SiCN, hydrogen doped SiCN, etc.

As shown in FIG. 12, a first interlayer dielectric (ILD) layer 110 is then formed on the cap layer 108. The first ILD layer 110 may include, for example, an ultra-low-κ (ULK) material or any other suitable dielectric material(s). Vias are then formed (not shown in FIG. 12) into the first ILD layer 110, the cap layer 108 and at least partially into the oxide layer 102. In the memory area, as shown in FIG. 12, these vias expose the combined via interconnect structure (e.g., a metal liner layer 104 and a metal layer 106). Then, a bottom metal liner layer 112 and a bottom metal layer 114 are formed in the vias, as shown in FIG. 1. These layers may be included in one of the BEOL layers. In certain examples, the bottom metal liner layer 112 may include, Nb, NbN, W, WN, Ta, TaN, Ti, TiN, Ru, Mo, Cr, V, Pd, Pt, Rh, Sc, Al and other high melting point metals or conductive metal nitrides. In certain examples, the bottom metal layer 114 may include, for example, Cu, W, Co, Ru, Al, etc. As shown in FIG. 12, the MRAM device includes a logic area and the memory area adjacent to the logic area.

As shown in FIG. 12, a dielectric cap layer 116 is formed on the first ILD layer 110 in the logic area of the semiconductor device 100. Thus, the bottom metal layers 114 in the memory area are still exposed. A bottom electrode contact (BEC) layer is formed over the entire semiconductor device. In certain examples, the BEC includes a first BEC layer 218 and a second BEC layer 220. In certain examples, the material composition of the first BEC layer 218 is different than the material for the second BEC layer 220 to allow for etching selectivity between the two layers. Then, in certain embodiments, a first CMP process may be utilized to planarize the surface of the first BEC layer 218, and a second CMP process may be utilized to planarize the surface of the second BEC layer 220. In other embodiments, the material composition of the first BEC layer 218 and the second BEC layer 220 are the same.

Next, as shown in FIG. 12, a hardmask 222 (e.g., a dielectric hardmask) is formed on the second BEC layer 220. In certain embodiments, the hardmask 222 is a multilayer hardmask. At least initially, the hardmask 222 is formed over the entire semiconductor device 200 as a continuous layer. In certain examples, the material of the hardmask 222 may be TaN or any other suitable material(s). For example, the hardmask 222 may include one or more of the following materials: TaN, WCN; TiN; TaAlN; WN; TEOS; low-κ and ULK etc.

Figure 13:
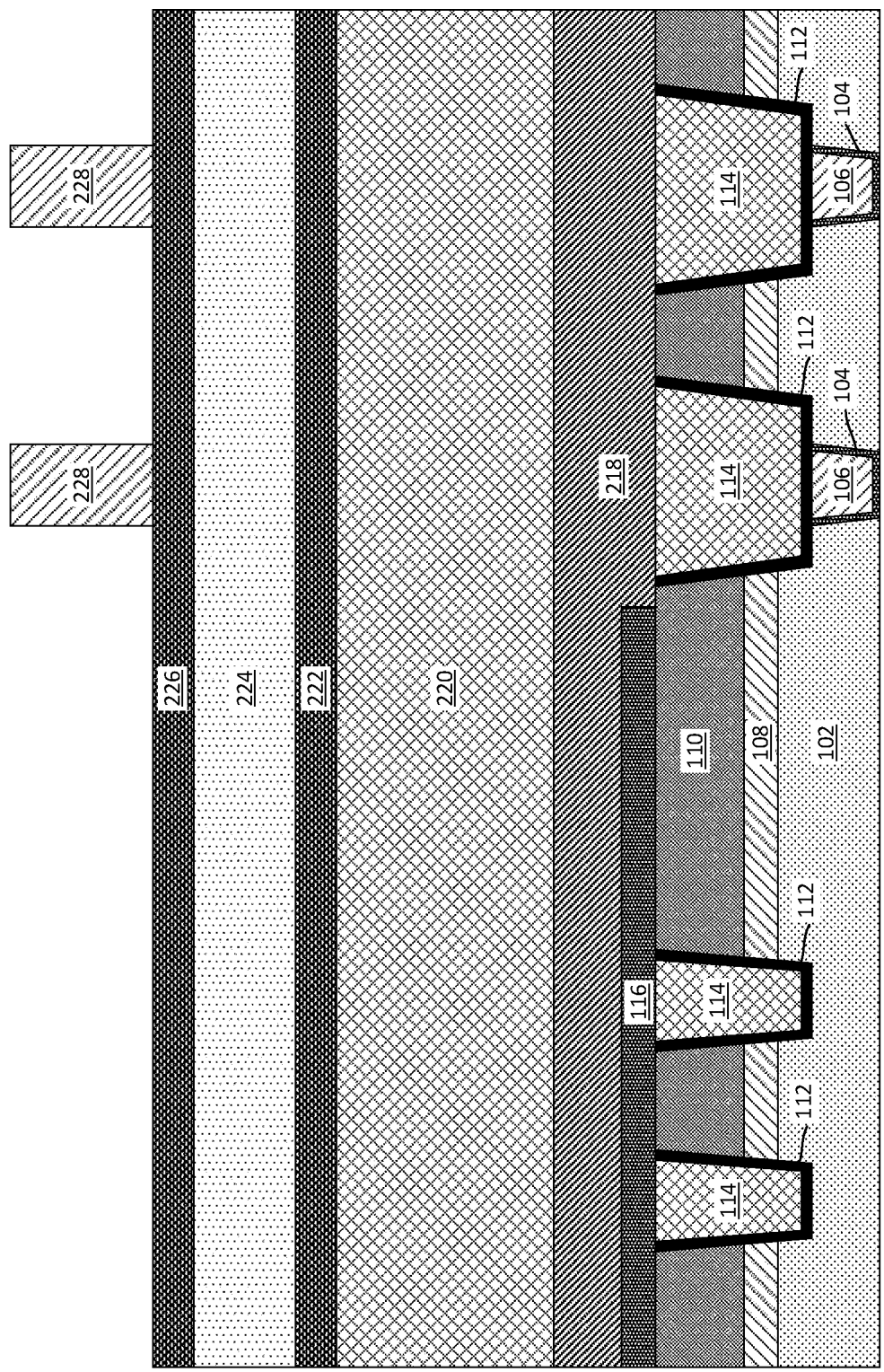
FIG. 13 is a cross-sectional view of a semiconductor device that includes an MRAM device at an intermediate stage of the manufacturing process, according to embodiments.

Referring now to FIG. 13, this figure is a cross-sectional view of the semiconductor device 200 including the MRAM of FIG. 12 after additional fabrication operations, according to embodiments. As shown in FIG. 13, a lithographic mask is formed that may be used to pattern the second BEC layer 220. In this example, the lithographic mask is a tri-layer mask including an organic planarizing layer 224, a lithographic hardmask 226 (e.g., SiARC, SiN, SiON, etc.), and a photoresist 228. It should be appreciated that the lithographic hardmask 226 may include a plurality of layers. The photoresist 228 may be formed by patterning using any suitable lithographic process.

Figure 14:
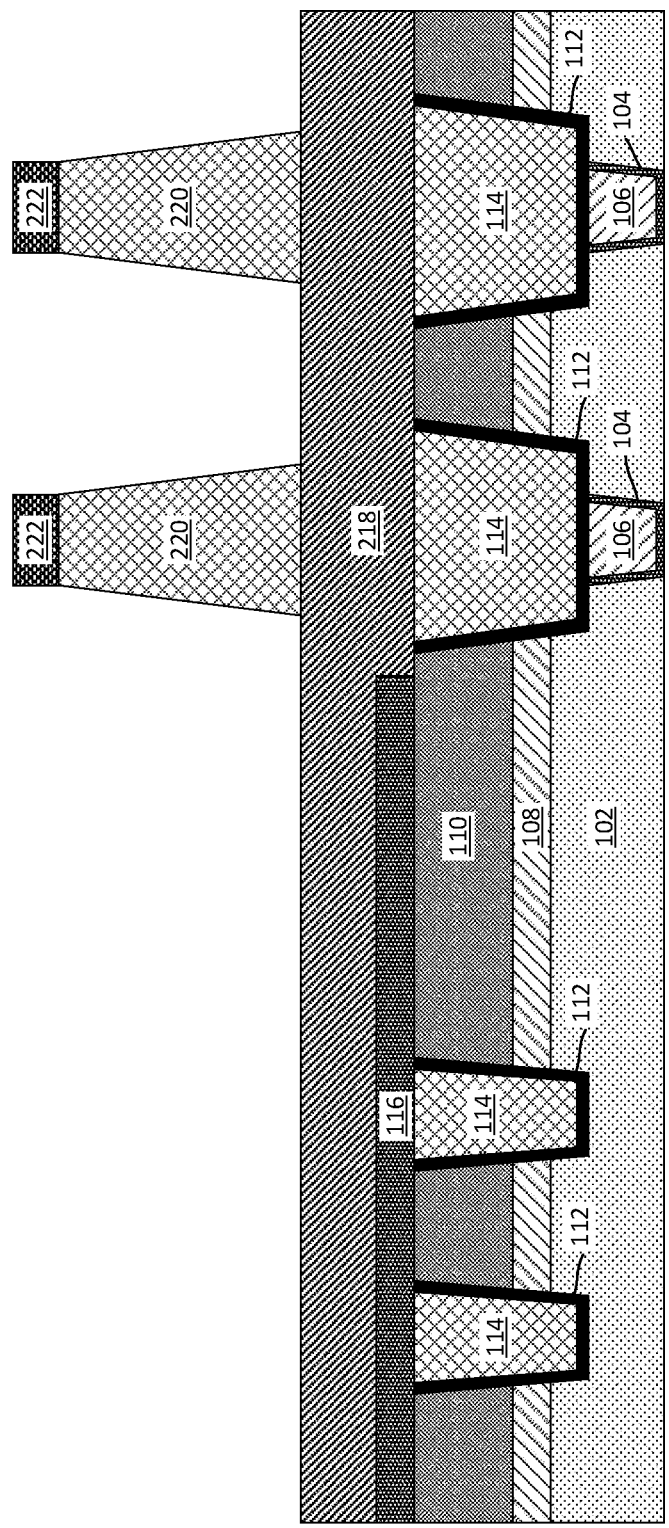
FIG. 14 is a cross-sectional view of the semiconductor device of FIG. 13 after additional fabrication operations, according to embodiments.

Referring now to FIG. 14, this figure is a cross-sectional view of the semiconductor device 200 including the MRAM of FIG. 13 after additional fabrication operations, according to embodiments. As shown in FIG. 14, a subtractive metal patterning process is performed to pattern the second BEC layer 220, stopping on the upper surface of the first BEC layer 218. As mentioned above, in embodiments where the material of the first BEC layer 218 is different from the material of the second BEC layer 220, an appropriate etchant may be used that is selective to the second BEC layer 220. In certain embodiments, as shown in FIG. 14, the resulting shape of the second BEC layer is tapered so that a CD of the top portion (or upper portion) thereof is less than the CD of the bottom portion (or lower portion). After the second BEC layer 220 has been formed, the lithographic mask (i.e., including the organic planarizing layer 224, a lithographic hardmask 226, and a photoresist 228) is removed, leaving the hardmask 222 on top of the second BEC layer 220.

Figure 15:
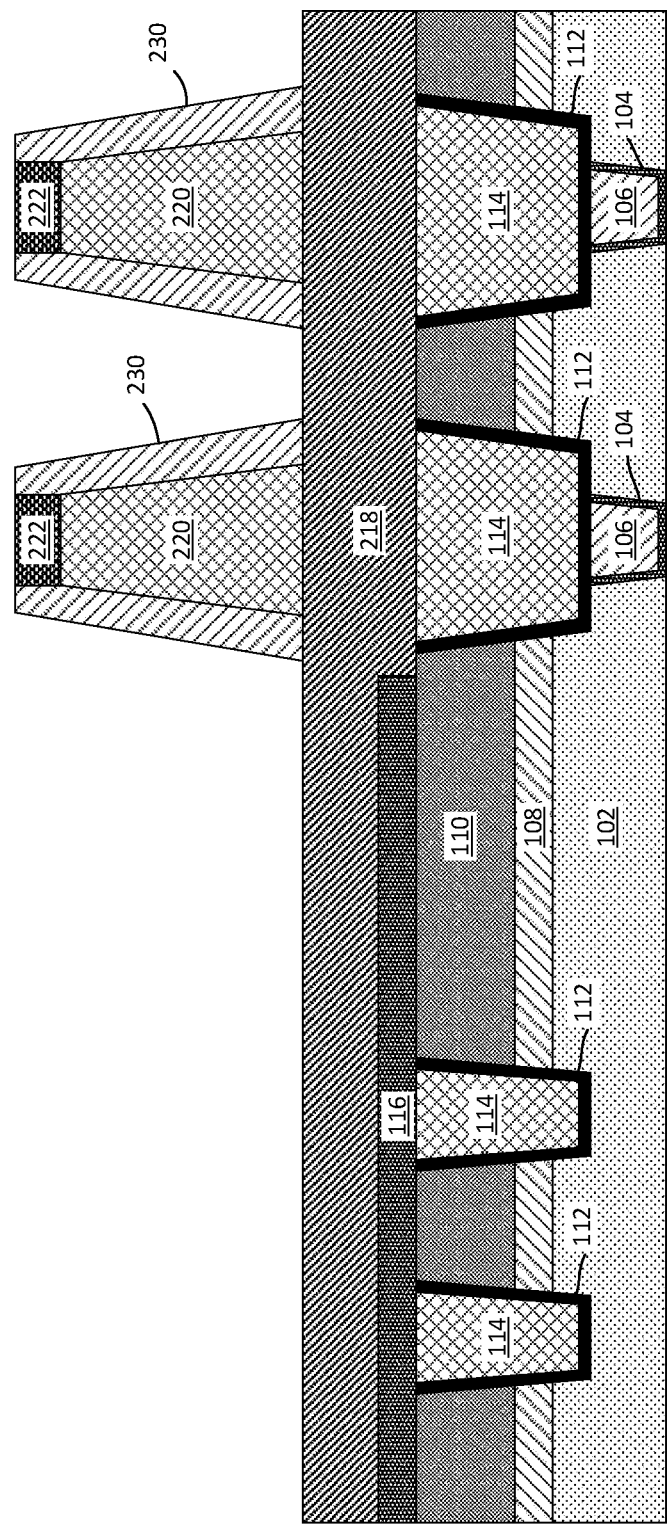
FIG. 15 is a cross-sectional view of the semiconductor device of FIG. 14 after additional fabrication operations, according to embodiments.

Referring now to FIG. 15, this figure is a cross-sectional view of the semiconductor device 200 including the MRAM of FIG. 14 after additional fabrication operations, according to embodiments. As shown in FIG. 15, a dielectric spacer layer 230 is formed. In one example, the dielectric spacer layer 230 can initially be deposited over the entire surface of the semiconductor device 200. Then, as shown in FIG. 15, an isotropic etching process is performed on the dielectric spacer layer 230 to remove the horizontal portions thereof. In other words, the dielectric spacer layer 230 only remains on the slanted sidewalls of the second BEC layer 220 and the hardmask 222. Once completed, the dielectric spacer layer 230 may itself be used as a mask for further processing of the first BEC layer 218, as described in detail below.

Figure 16:
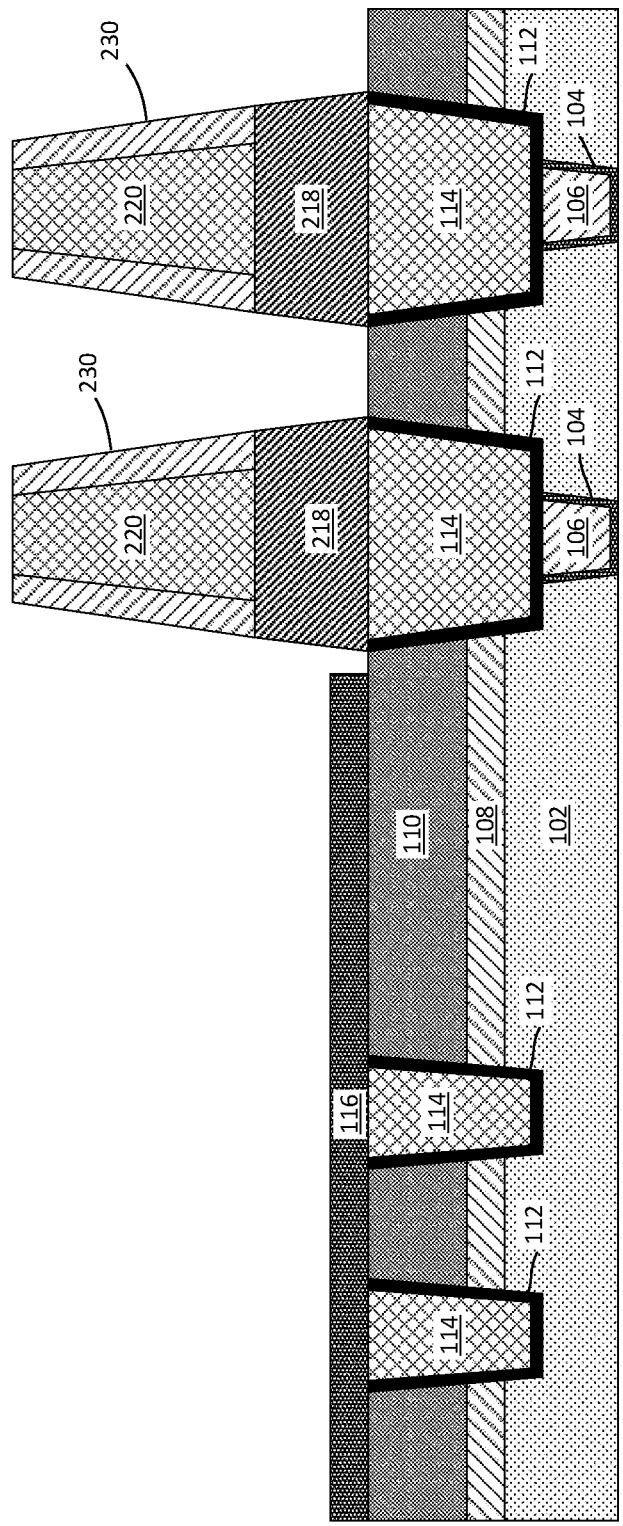
FIG. 16 is a cross-sectional view of the semiconductor device of FIG. 15 after additional fabrication operations, according to embodiments.

Referring now to FIG. 16, this figure is a cross-sectional view of the semiconductor device 200 including the MRAM of FIG. 15 after additional fabrication operations, according to embodiments. As shown in FIG. 16, another subtractive metal patterning process is performed to pattern the first BEC layer 218, stopping on the upper surface of the first ILD layer 110. As mentioned above, in embodiments where the material of the first BEC layer 218 is different from the material of the second BEC layer 220, an appropriate etchant may be used that is selective to the first BEC layer 218. In certain embodiments, as shown in FIG. 14, the resulting shape of the first BEC layer 218 is also tapered so that a CD of the top portion thereof is less than the CD of the bottom portion. Also, owing to the thickness of the dielectric spacer layer 230, the CD of the top portion of the first BEC layer 218 is less than the CD of the bottom portion of the second BEC layer 220. Because the first BEC layer 218 and the second BEC layer 220 are formed by a subtractive process (i.e., rather than related additive damascene process), multilayered BEC has a tapered shape. When the bottom electrode contact (BEC) has a tapered sidewall profile with a top CD smaller than the bottom CD (i.e., the profile narrows in an upward direction), this may increase a margin for exposing the BEC during IBE due to any misalignment. Moreover, because there is no requirement for filling the BEC in the present embodiments, there is no issue with a high aspect ratio (i.e., incomplete filling or voids in the BEC). Moreover, the stepped conical shape (or stepped tapered profile) of the first BEC layer 218 and the second BEC layer 220 (versus an inverse conical shape resulting from a related damascene process) results in the lower CD on the top of the second BEC layer 220. The lower CD of the top of the second BEC layer 220 in the present embodiments may make it easier to hide the overall BEC under the MRAM stack, and thus eliminate or reduce any sputtering that may occur in the IBE processing step. It should be appreciated that the first BEC layer 218 and the second BEC layer 220 may be patterned by any suitable combination of processing steps, including using lithography masks (e.g., a single layer or multilayer mask) to transfer the pattern, and then etching.

Figure 17:
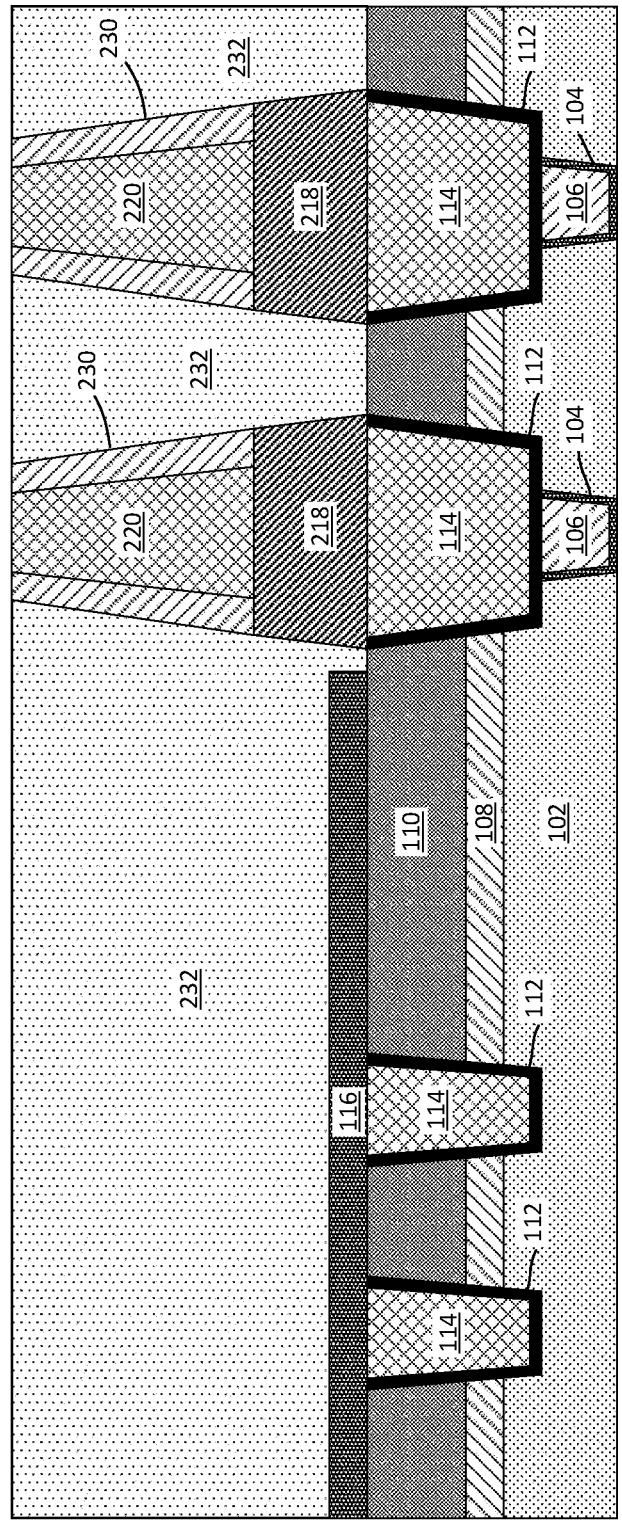
FIG. 17 is a cross-sectional view of the semiconductor device of FIG. 16 after additional fabrication operations, according to embodiments.

Referring now to FIG. 17, this figure is a cross-sectional view of the semiconductor device 200 including the MRAM of FIG. 16 after additional fabrication operations, according to embodiments. As shown in FIG. 17, a second ILD layer 232 is deposited over the entire semiconductor device 200 and fills in areas between adjacent BECs (i.e., the combination of the first BEC layer 218, the second BEC layer 220 and the dielectric spacer layer 230). Then, in certain embodiments, a CMP process may be utilized to planarize the surface of the second ILD layer 232 and expose the top surfaces of the second BEC layers 220.

Figure 18:
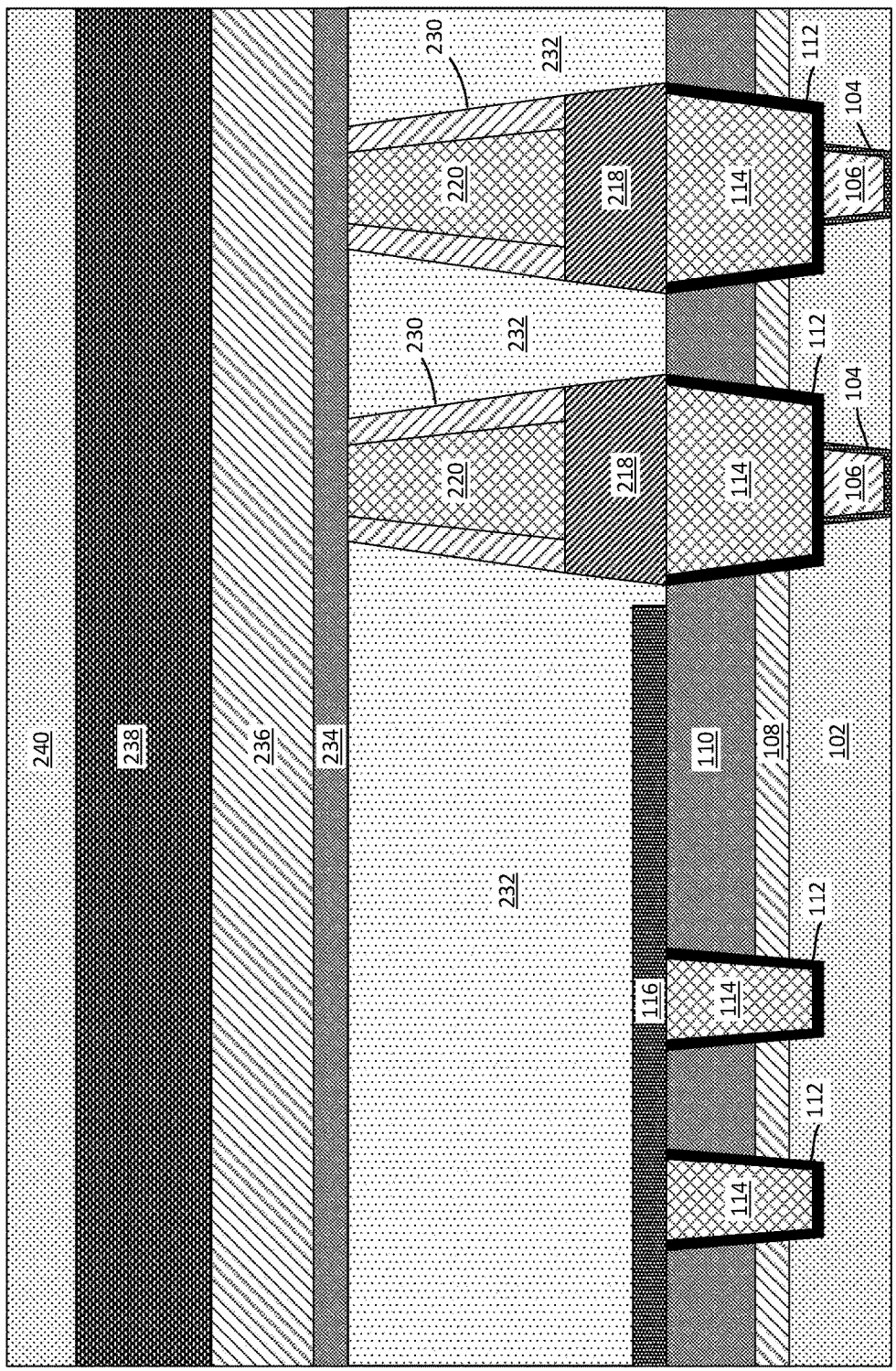
FIG. 18 is a cross-sectional view of a semiconductor device that includes an MRAM device at an intermediate stage of the manufacturing process, according to embodiments.

Referring now to FIG. 18, this figure is a cross-sectional view of the semiconductor device 200 including the MRAM of FIG. 17 after additional fabrication operations, according to embodiments. As shown in FIG. 18, an MRAM stack is formed on the upper surfaces of the second BEC layer 220, the dielectric spacer layer 230, and the second ILD layer 232. The MRAM stack may include multiple layers such as, for example, multiple magnetic layers separated by an insulating layer. In certain embodiments, the MRAM stack includes a bottom electrode 234, an MTJ stack 236, and a top electrode 238. The top electrode 238 may include one or more of Nb, NbN, W, WN, Ta, TaN, Ti, TiN, Ru, Mo, Cr, V, Pd, Pt, Rh, Sc, Al and other high melting point metals or conductive metal nitrides, etc. In certain embodiments, the MTJ stack 236 includes a reference layer (not shown), a tunnel barrier layer (not shown), and a magnetic free layer (not shown). The reference layer (or fixed layer) may, for example, be annealed in a magnetic field to set a polarization state of the reference layer in the MTJ stack 236. The tunnel barrier layer is formed on the reference layer. Following the formation of the tunnel barrier layer, the magnetic free layer is formed on the tunnel barrier layer.

It should be appreciated that this MRAM stack structure is only an example, and any other suitable MRAM stack structure known to one of skill in the art may be utilized. It should also be appreciated that this example MRAM stack structure may include one or more additional layers, include intervening layers, and any of the layers described with respect to the MRAM stack structure may contain a plurality of sublayers.

Next, as shown in FIG. 18, a hardmask 240 (e.g., a dielectric hardmask) is formed on the top electrode 238. In certain embodiments, the hardmask 240 is a multilayer hardmask. At least initially, the hardmask 240 is formed over the entire semiconductor device 200 as a continuous layer. In certain examples, the material of the hardmask 240 may be TaN or any other suitable material(s). For example, the hardmask 240 may include one or more of the following materials: TaN; WCN; TiN; TaAIN; WN; TEOS; low-κ and ULK etc.

Figure 19:
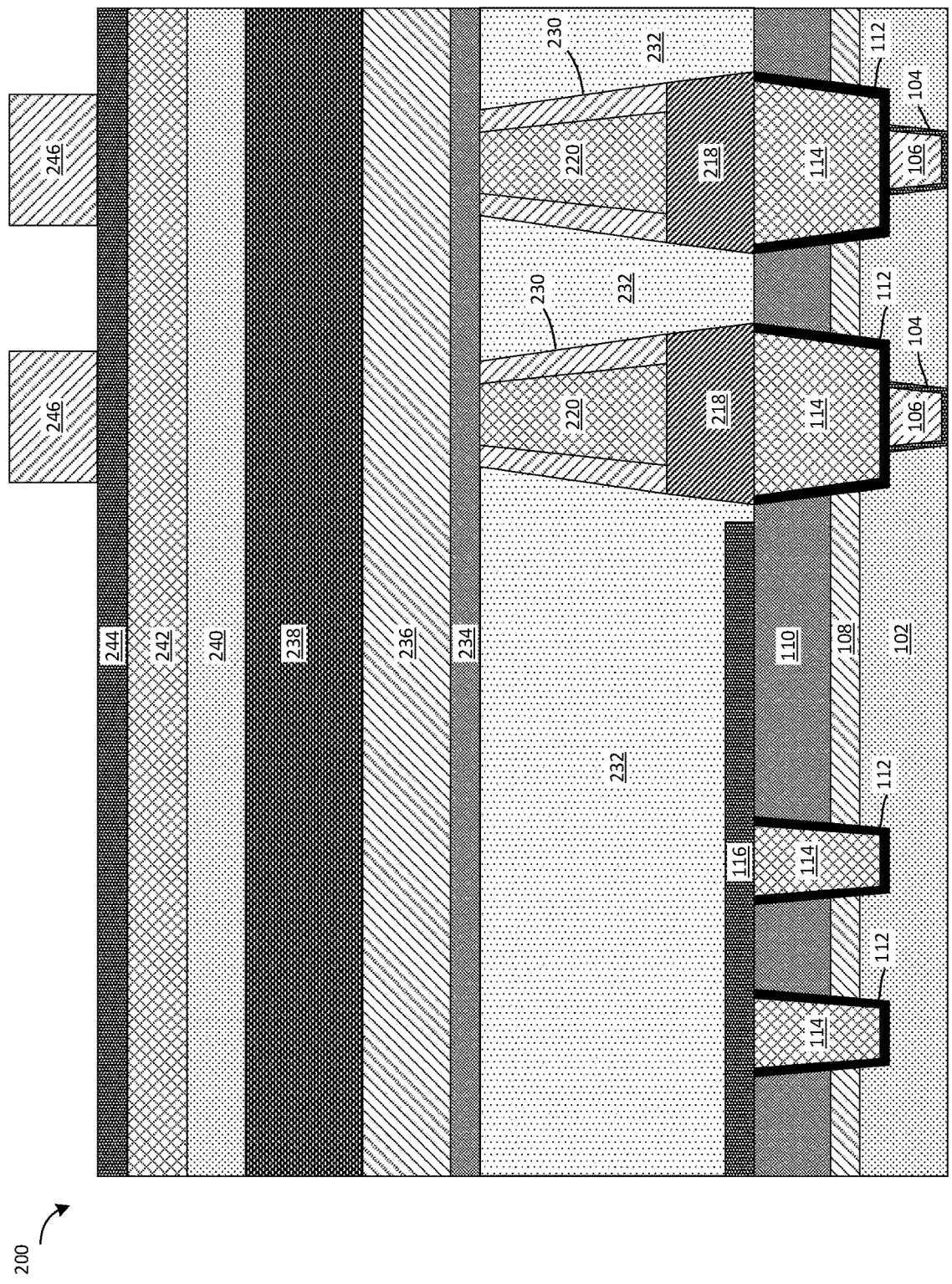
FIG. 19 is a cross-sectional view of the semiconductor device of FIG. 18 after additional fabrication operations, according to embodiments.

Referring now to FIG. 19, this figure is a cross-sectional view of the semiconductor device 200 including the MRAM of FIG. 18 after additional fabrication operations, according to embodiments. As shown in FIG. 19, a lithographic mask is formed that may be used to pattern the MRAM stack. In this example, the lithographic mask is a tri-layer mask including an organic planarizing layer 242, a lithographic hardmask 244 (e.g., SiARC, SiN, SiON, etc.), and a photoresist 246. It should be appreciated that the lithographic hardmask 244 may include a plurality of layers. The photoresist 246 may be formed by patterning using any suitable lithographic process.

Figure 20:
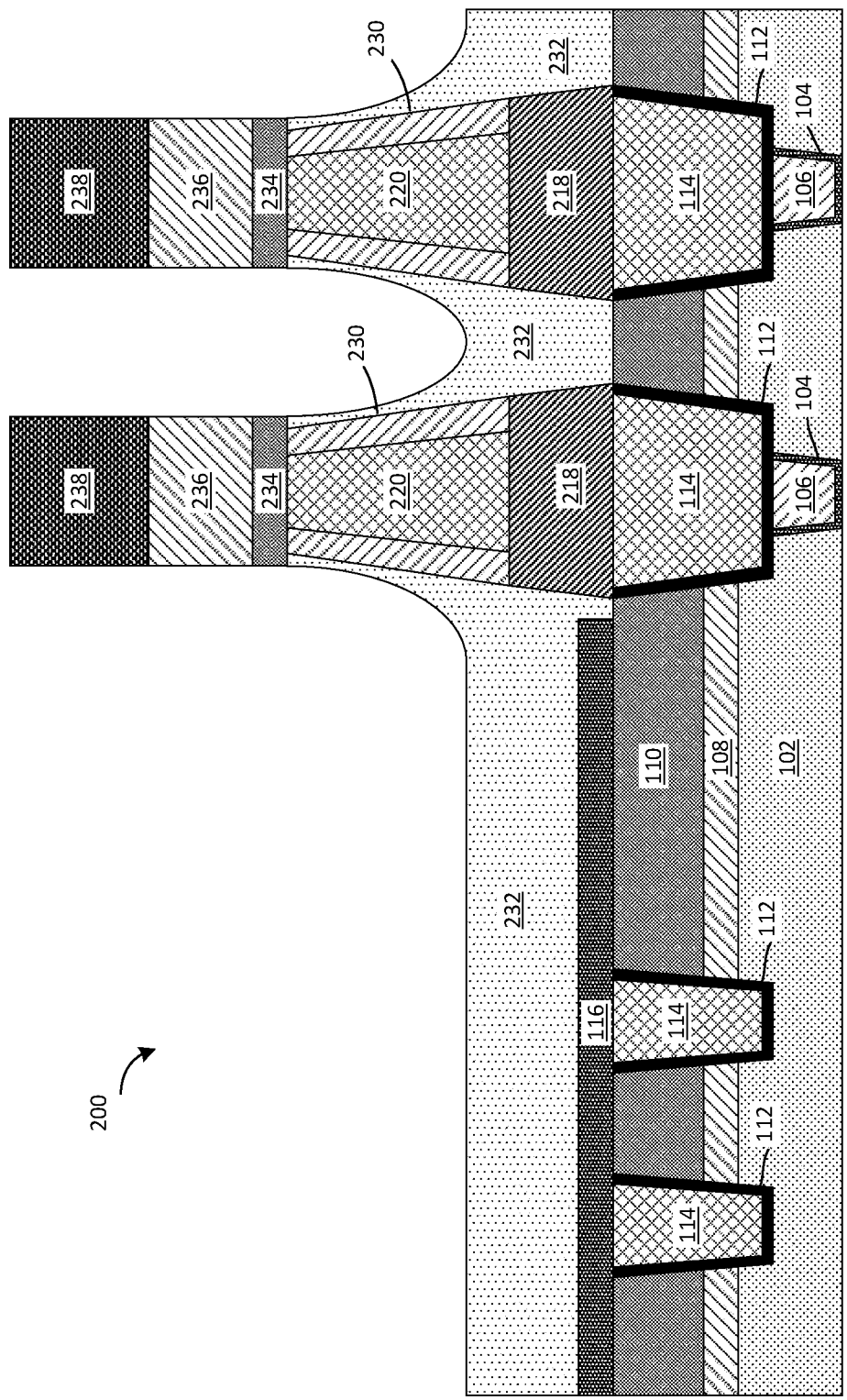
FIG. 20 is a cross-sectional view of the semiconductor device of FIG. 19 after additional fabrication operations, according to embodiments.

Referring now to FIG. 20, this figure is a cross-sectional view of the semiconductor device 200 including the MRAM of FIG. 19 after additional fabrication operations, according to embodiments. As shown in FIG. 20, the pattern of the photoresist 246 layer is transferred to the magnetic tunnel junction (MTJ) stack 236 (i.e., the reference layer, the tunnel barrier layer, and the magnetic free layer), which is etched to create the MTJ pillars. In one example, a two-step material removal process is used to form the MTJ pillars. In a first material removal step, RIE is used to remove the material down to the level of the top of the MTJ stack 236 (i.e., removing the material of the hardmask 240, the organic planarizing layer 242, and the lithographic hardmask 244. In a second material removal step, an IBE process is used to remove the material of the MTJ stack 236, the bottom electrode 234 and at least portions of the second ILD layer 232. After the pattern of the photoresist 246 has been transferred to the create the MTJ pillars, the photoresist 246, the lithographic hardmask 244, the organic planarization layer 242 and the hardmask 240 are removed using, for example, an ashing process. The IBE etching process is a non-selective etching operation, so the dielectric material of the second ILD layer 232 is removed in such a way as to create a gouged sidewall profile (or slanted, or curved shaped profile). It should be appreciated that when using the IBE etching process, there are no portions of the first BEC layer 218 or the second BEC layer 220 that are exposed. Moreover, the dielectric spacer layer 230 covers the sidewall of the second BEC layer 220, so that also functions as a protective layer to prevent exposure of the slanted sidewalls of the second BEC layer 220. Also, there is a significant amount of material of the second ILD layer 232 that covers the first BEC layer 218. Therefore, to the extent that there is any sputtering of material during IBE, it is only the dielectric material of the second ILD layer 232 that may be deposited on the sidewalls of the MTJ stack 236. Accordingly, in the present embodiments, there may be a benefit of reducing the occurrence of electrical shorts (i.e., relative to the related damascene process where portions of the BEC having the larger top CD could potentially be exposed due to misalignment) due the relative smaller CD of the top of the second BEC layer 220. In other words, there is a sufficient thickness of second ILD layer 232 on the sidewalls of the first BEC layer 218 (and there is the dielectric spacer layer 230 on sidewalls of the second BEC layer 220) so that even if there is some misalignment, the sidewalls of the BEC will not be exposed to the IBE process (i.e., low or no risk of metal sputtering from the first BEC layer 218 or the second BEC layer 220).

Figure 21:
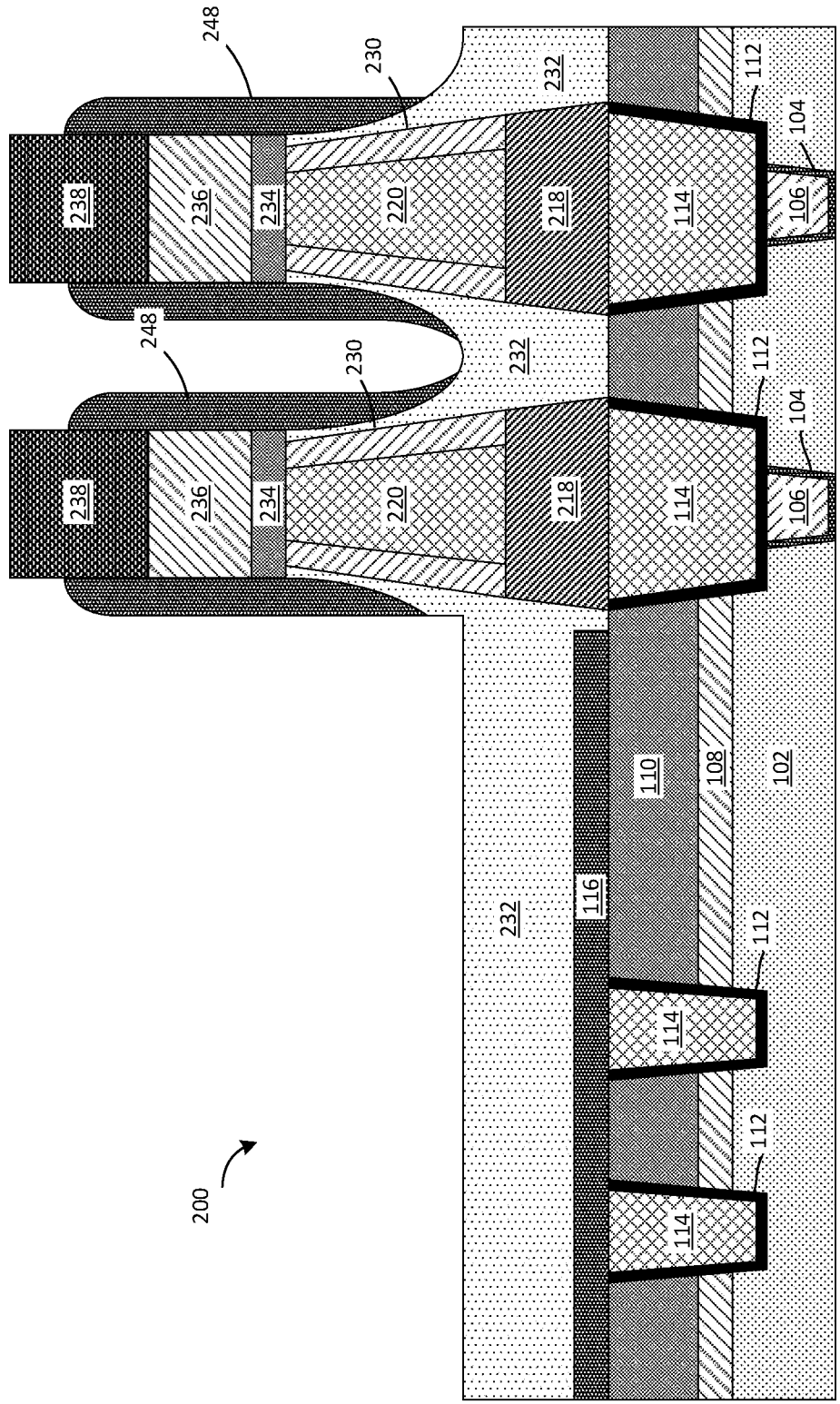
FIG. 21 is a cross-sectional view of the semiconductor device of FIG. 20 after additional fabrication operations, according to embodiments.

Referring now to FIG. 21, this figure is a cross-sectional view of the semiconductor device 200 including the MRAM of FIG. 20 after additional fabrication operations, according to embodiments. As shown in FIG. 21, a dielectric encapsulation layer 248 is initially formed over the entire semiconductor device 200. The dielectric encapsulation layer 248 may include, for example, SiN or SiCN (H), or any other suitable dielectric material. One purpose of the dielectric encapsulation layer 248 is to isolate the tunnel barrier layer of the MTJ stack 236 from the outside environment. An isotropic etching process is performed on the dielectric encapsulation layer 248 to remove the horizontal portions thereof. In other words, the dielectric encapsulation layer 248 only remains on the vertical sidewalls of the MTJ stack 236, bottom electrode 234 and top electrode 238. This material removal process also exposes the second ILD layer 232 in the logic area of the device.

Figure 22:
FIG. 22 is a cross-sectional view of the semiconductor device of FIG. 21 after additional fabrication operations, according to embodiments.

Referring now to FIG. 22, this figure is a cross-sectional view of the semiconductor device 200 including the MRAM of FIG. 21 after additional fabrication operations, according to embodiments. As shown in FIG. 22, a dielectric fill layer 250 is formed in and around the MTJ pillars. In certain examples, the formation of the dielectric fill layer 250 may be an oxide based dielectric material that may be formed by an aggressive deposition process. Thus, the dielectric encapsulation layer 250 may help protect the tunnel barrier layer from damage during such a process. Then, vias are formed in the logic area and memory area by any suitable combination of processes that are known to a person of skill in the art. A first top contact 254 is formed in the via in the logic area of the semiconductor device 200, and a second top contact 256 is formed in the via in the memory area.

Thus, in the embodiments described above, rather than using an additive process (e.g., a damascene process) to form the BEC (or the first and second BEC layers), a subtractive etching process (or processes) is used, which results in the tapered sidewall structure of the BEC where the top CD is smaller than the bottom CD of the BEC. When the bottom electrode contact (BEC) has a tapered sidewall profile with a top CD smaller than the bottom CD, this may increase a margin for exposing the BEC during IBE due to any misalignment. Moreover, because there is no requirement for filling the BEC in the present embodiments, there is no issue with a high aspect ratio (i.e., incomplete filling or voids in the BEC). Moreover, the conical shape, for example, of the BEC (versus an inverse conical shape resulting from a related damascene process) results in the lower CD on the top of the BEC. The lower CD of the top of the BEC in the present embodiments may make it easier to hide the BEC under the MRAM stack, and thus eliminate or reduce any sputtering that may occur in the IBE processing step.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a semiconductor device, the method comprising:
    forming a bottom contact electrode (BEC); and
    forming an MRAM stack on the BEC,
    wherein a width of an upper portion of the BEC is less than a width of the MRAM stack and less than a width of a lower portion of the BBC.

2. The method according to claim 1, wherein the BEC is formed by a subtractive etching process.

3. The method according to claim 1, wherein the BEC has a tapered shape.

4. The method according to claim 1, wherein forming the BEC comprises:
    forming a BEC layer on an interconnect layer; and
    etching the BEC layer using at least one of RIE and IBE to form the BEC.

5. The method according to claim 1, wherein forming the BEC comprises:
    forming a first BEC layer on an interconnect layer;
    forming a second BEC layer on the first BEC layer, the second BEC layer having a different material composition than that of the first BEC layer;
    etching the second BEC layer;
    forming a sidewall spacer layer on sidewalls of the second BEC layer; and
    etching the first BEC layer.

6. The method according to claim 5, wherein the first BEC layer and the second BEC layer have a stepped tapered profile.

7. The method according to claim 6,
    wherein a width of an upper portion of the first BEC layer is less than a width of a lower portion of the first BEC layer;
    wherein a width of an upper portion of the second BEC layer is less than a width of a lower portion of the second BEC layer; and
    wherein the width of the lower portion of the second BEC layer is less than the width of the upper portion of the first BEC layer.

8. The method according to claim 5, wherein the first BEC layer and the second BEC layer both have a truncated conical shape.

9. The method according to claim 1, wherein the MRAM stack includes a bottom electrode, an MTJ stack, and a top electrode.

10. The method according to claim 1, further comprising forming an interlayer dielectric around the MRAM stack, and forming a top electrode contact on the MRAM stack.

11. A semiconductor device comprising:
    a bottom contact electrode (BEC); and
    an MRAM stack formed on the BEC,
    wherein a width of an upper portion of the BEC is less than a width of the MRAM stack and less than a width of a lower portion of the BEC.

12. The semiconductor device according to claim 11, wherein the BEC has a tapered shape.

13. The semiconductor device according to claim 11, wherein the BEC comprises:
    a first BEC layer formed on an interconnect layer;
    a second BEC layer formed on the first BEC layer, the second BEC layer having a different material composition than that of the first BEC layer; and
    a dielectric spacer layer formed on sidewalls of the second BEC layer.

14. The semiconductor device according to claim 13, wherein the first BEC layer and the second BEC layer have a stepped tapered profile.

15. The semiconductor device according to claim 13,
    wherein a width of an upper portion of the first BEC layer is less than a width of a lower portion of the first BEC layer;
    wherein a width of an upper portion of the second BEC layer is less than a width of a lower portion of the second BEC layer; and
    wherein the width of the lower portion of the second BEC layer is less than the width of the upper portion of the first BEC layer.

16. The semiconductor device according to claim 13, wherein the first BEC layer and the second BEC layer both have a truncated conical shape.

17. The semiconductor device according to claim 11, wherein the MRAM stack includes a bottom electrode, an MTJ stack, and a top electrode.

18. The semiconductor device according to claim 17, further comprising a dielectric encapsulation layer formed on sidewalls of the MTJ stack.

19. The semiconductor device according to claim 11, further comprising an interlayer dielectric formed around the MRAM stack, and a top electrode contact formed on the MRAM stack.

20. The semiconductor device according to claim 11, wherein the BEC has a truncated conical shape.

* * * * *